US005755935A

United States Patent [19]
Jackson et al.

[11] Patent Number: 5,755,935
[45] Date of Patent: May 26, 1998

[54] PROCESSING SYSTEM

[76] Inventors: Dale Jackson, 1926 Oro Ct., Clearwater, Fla. 34624; Rick Hoving, 10956 111th St. North, Largo, Fla. 34648; Vladimir Velitschkouski, 5105 39th Ave. North, St. Petersburg, Fla. 33709; Renn Grear, 433 S. Paula Dr. #26, Dunedin, Fla. 34698; Dan Kostecke, 3728 Homestead Dr., Waterford, Mich. 48329

[21] Appl. No.: 612,226

[22] Filed: Mar. 7, 1996

[51] Int. Cl.⁶ .............. C25D 17/00; B05C 3/02; B05C 3/12; B05C 19/02
[52] U.S. Cl. .............. 204/202; 204/206; 118/405; 118/419; 118/423
[58] Field of Search .............. 204/198, 202, 204/206; 118/405, 423, 419

[56] References Cited

U.S. PATENT DOCUMENTS

| | | | |
|---|---|---|---|
| 3,607,711 | 9/1971 | Koch, II | 204/198 |
| 4,162,955 | 7/1979 | Schregenberger | 204/202 X |
| 4,534,843 | 8/1985 | Johnson et al. | 204/202 |
| 4,783,244 | 11/1988 | Bläsing et al. | 204/198 X |
| 4,806,223 | 2/1989 | Murakami | 204/206 |
| 4,885,071 | 12/1989 | Murakami | 204/206 |
| 5,098,544 | 3/1992 | Brannan et al. | 204/206 |

*Primary Examiner*—Donald R. Valentine
*Attorney, Agent, or Firm*—A. W. Fisher, III

[57] ABSTRACT

A processing system to produce printed circuits or other finished materials on a continous strip of substrate comprising a processing cabinet having an entry opening and an exit opening formed on opposite ends thereof, a supply station and a take-up station disposed adjacent the entry opening and the exit opening respectively, a transport mechanism to transport the continuous strip of substrate from the supply station through the entry opening, the processing cabinet and the exit opening to the take-up station and a system control to selectively control the tension and speed of the continuous strip of substrate traveling from the supply station to the take-up station.

48 Claims, 25 Drawing Sheets

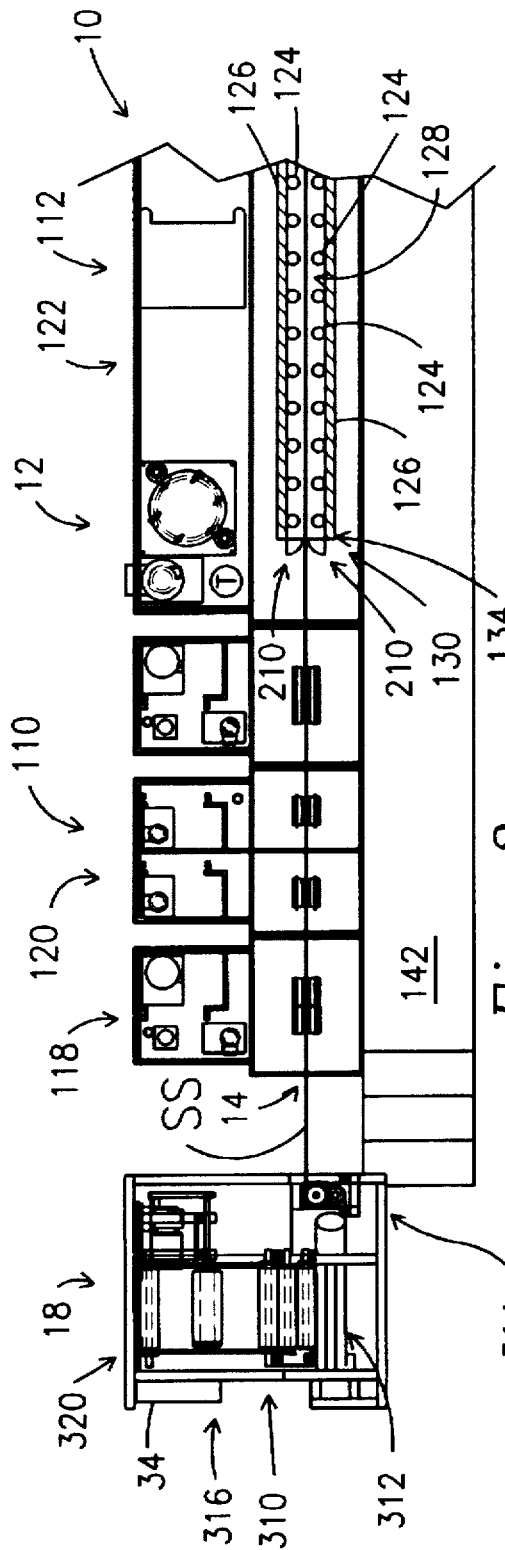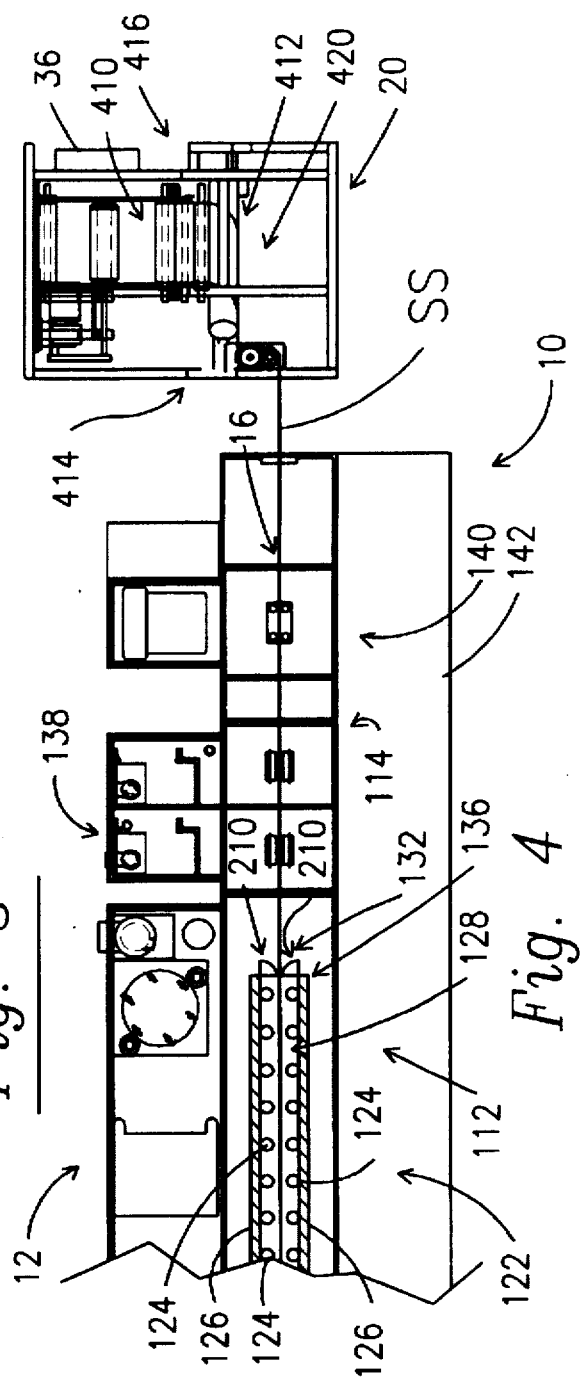
Fig. 3
Fig. 4

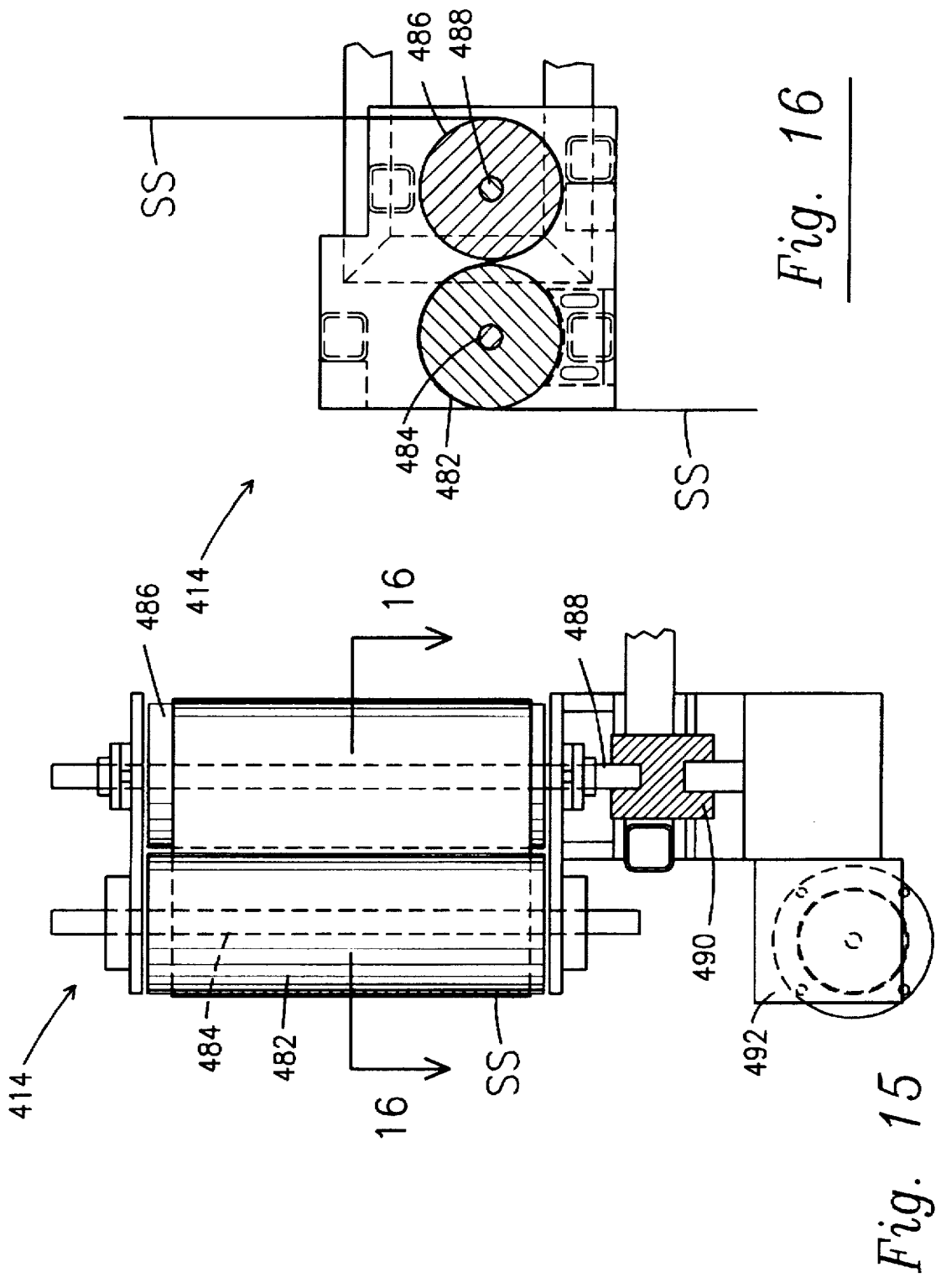

PROCESSING SYSTEM

BACKGROUND OF THE INVENTION

1. Field of the Invention

A processing system to produce printed circuits or other finished materials on a continuous strip of substrate.

2. Description of the Prior Art

Printed circuit boards are normally formed of a relatively inert material such as fiberglass reinforced board with cladding on both sides thereof. A photoresist is then applied to one or both sides of the board. The photoresist is essentially inert to the plating processes that, after being exposed to a circuit pattern and developed, defines a pattern in developed voids of the photoresist. The boards may be electrically charged and placed in a solution including a metal to be deposited thereon. After the metal is deposited the boards are rinsed. The photoresist is then removed and the cladded layer is etched off the board, leaving the circuit plated on the board.

U.S. Pat. No. 5,211,756 teaches an apparatus to manufacture or produce articles such as printed circuit boards comprising at least one module having an entry and exit opening formed on opposite ends thereof and a transport mechanism comprising a continuous conveyor including a plurality of interconnected conveyor links to support the articles thereon and an entry and exit roller seal assembly each including a pair of rotatable seal rollers disposed to seal the entry and exit openings respectively and engage the articles passing through the entry and exit openings respectively. An article guide maintains the articles in a substantially vertical position as the articles transverse the apparatus and a fluid supply to expose both sides of the article uniformly with fluid.

U.S. Pat. No. 4,620,894 relates to a method and apparatus for etching and otherwise chemically treating electronic printed circuit board substrates comprising a hollow tubing to engage and transport the circuit board substrates.

U.S. Pat. No. 4,611,554 discloses a device and method for the treating of vertically disposed printed circuit boards comprising a transport conveyor above an accumulating reservoir and below spraying nozzles applying a process solution to the side surfaces of each printed circuit board.

U.S. Pat. No. 4,620,894 shows a method and apparatus for chemically treating vertically disposed circuit board substrates comprising a conveyor system for transporting the vertically disposed circuit board substrates through a plurality of adjacent spray chambers employing hollow slack tubing to engage and transport the substrates.

U.S. Pat. No. 4,401,522 relates to a continuous metal exchange for workplaces such as a printed circuit board comprising a continuous horizontal transport and plating tank. Opposite ends of the plating tank include slots to receive and discharge the workplaces sealed by opposed rollers. The workplaces are held by a non-conductive hanger coupled to the upper portion thereof.

U.S. Pat. No. 4,427,019 discloses a continuous processing of flat workpieces such as printed circuit boards suspended by a hanger on a conveyor for continuous horizontal transport. The conveyor transports the workpieces through a plurality of chambers having slotted-end members.

U.S. Pat. No. 3,910,406 relates to a two-part clip each including a base and leg having a socket for receiving the outer end of a connecting pin of an articulated roller chain conveyor. A support surface is formed from a rod extending outwardly from the two-part clip. The two-part clip may include a drive engaging member to permit an articulated roller chain carrying the two-part clip to be driven by a drive mechanism.

U.S. Pat. No. 4,530,433 discloses a pincer comprising a plate having lateral openings on one side thereof and a center opening on the other side thereof coupled to adjacent plates to form a conveyor chain for bottles gripped by a pair of jaws. The pincer cooperates with a half-collar fitting the outline of the neck of a bottle being processed.

U.S. Pat. No. 5,113,785 discloses a transport device including holders for taking hold of the boards at the edges thereof being handled, and various advancing means, especially a pulling element which has the holders permanently attached thereto within an endlessly circulating chain for transporting the holders and the boards. The holder has two parallel bars on each of which two rows of prongs arranged in the form of a rake. Martin shows neither a board holder nor guide.

U.S. Pat. No. 4,611,554 shows treating printed circuit boards by spraying fluid with a spray nozzle.

FR 2,439,734 teaches an apparatus for manufacturing printed circuit boards in which the boards are carried vertically by article guides on a conveyor with interconnected links. Shows a plurality of holders each including a channel to receive and house the lower portion of the printed circuit boards. This prevents treating the entire surfaces of the boards.

SUMMARY OF THE INVENTION

The present invention relates to a electro-coating, wet process surface finishing or plating system to produce printed circuits or other finished materials on a continuous strip of substrate including a processing cabinet having an entry opening and an exit opening formed on opposite ends thereof. A supply station to feed the continuous strip of unprocessed substrate to the processing cabinet and a take-up station to retrieve the continuous strip of processed substrate from the processing cabinet are disposed adjacent the entry opening and the exit opening respectively. A transport mechanism including a clip engagement station and a clip release station is provided to transport the continuous strip of substrate from the supply station through the entry opening, the processing cabinet and the exit opening to the take-up station.

A first and second fluid seal assembly are disposed on opposite ends of the processing cabinet to form a fluid seal. Each fluid seal assembly includes a fluid directional control means to direct a sealing fluid or solution into the processing cabinet creating a fluid barrier immediately adjacent each side of the continuous strip of substrate to retain the processing fluid therein.

The supply station comprises a supply assembly to supply a horizontally disposed continuous strip of unprocessed substrate, a supply directional change assembly to translate or reposition the continuouse strip of unprocessed substrate from the horizontal to vertical and a supply feed assembly to feed the vertically disposed continuous strip of unprocessed substrate to the clip engagement station.

The take-up station comprises a take-up retrieval assembly to retrieve the vertically disposed continuous strip of processed substrate from the clip release station, a take-up directional change assembly to translate or reposition the continuouse strip of processed substrate from the vertical to horizontal and a take-up assembly to receive the horizontally disposed continuous strip of processed substrate.

The film transport mechanism includes a plurality of clips attached to a continuous link chain in conventional fashion extending between the clip engagement station, the clip release station and a transport drive means. Each clip comprises a first clamping tip and a second clamping tip movable between a first or closed position and a second or open position to selectively engage and release the continuous strip of substrate at the clip engagement station and clip release station respectively.

The clip engagement station comprises a cam element and a cam plate having a cam surface disposed to selectively engage a portion of the individual clips traversing the clip engagement station to grasp or clamp the upper edge of the continuous strip of unprocessed substrate between corresponding first and second clamping tips.

The clip release station comprises a clip release camming section to open the individual clips traversing therethrough and a clip release directional transition section to move the individual clips vertically away from the continuous strip of processed substrate before the individual clips close to prevent reengagement therebetween.

Properly installed and assembled, power and control signals are fed from the system control through an electrical harness to various system components to feed, transport and retrieve the continuous strip of substrate from the supply station through the processing cabinet and to the take-up station.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the nature and object of the invention, reference should be had to the following detailed description taken in connection with the accompanying drawings in which:

FIG. 3 is a partial top view of the vertical processing system of the present invention showing the supply station.

FIG. 4 is a partial top view of the vertical processing system of the present invention showing the take-up station.

FIG. 15 is an end view of the take-up assembly of the take-up station of the present invention.

FIG. 16 is a cross-sectional top view of the take-up assembly of the take-up station of the present invention taken along line 16—16 of FIG. 15.

Similar reference characters refer to similar parts throughout the several views of the drawings.

DETAILED DESCRIPTION OF THE PREFERRED EMBODIMENT

Figure 1:
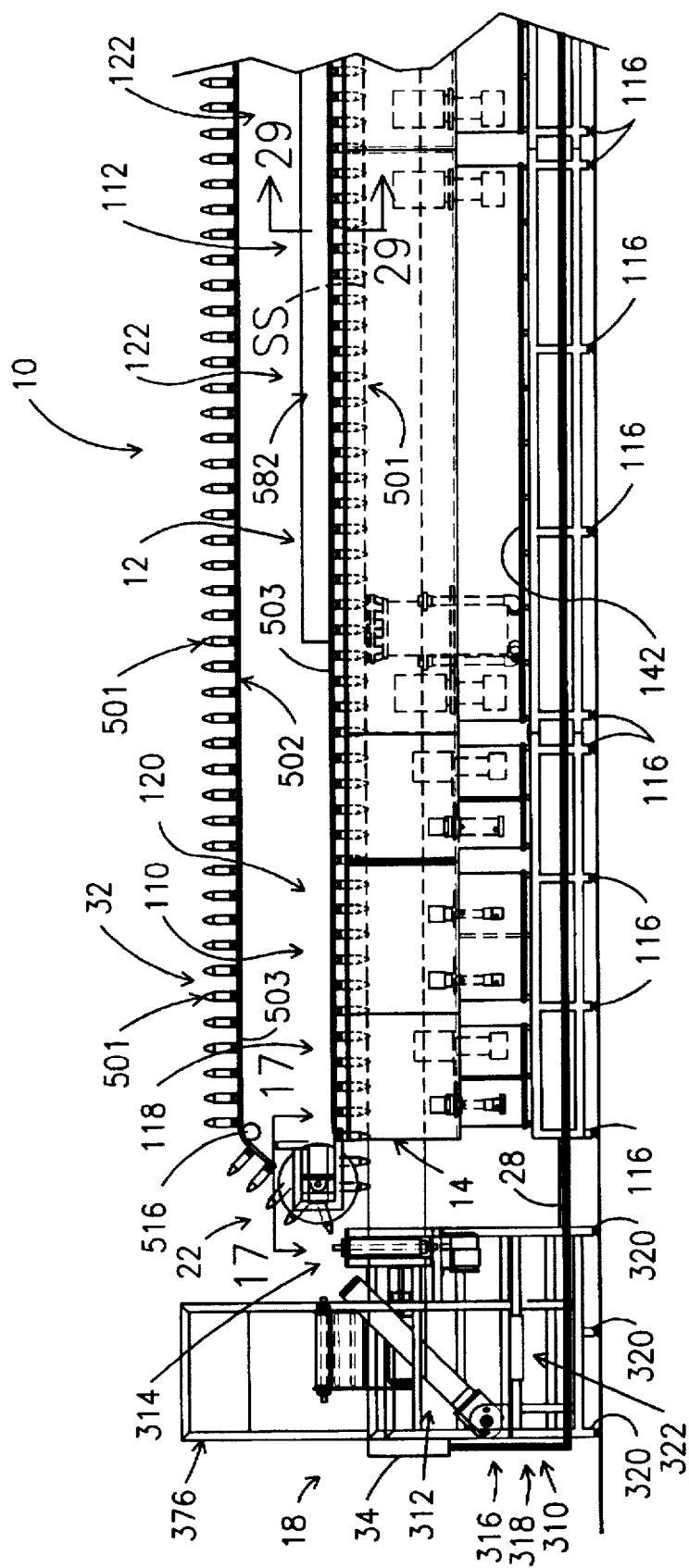
FIG. 1 is a partial side view of the vertical processing system of the present invention showing the supply station.

The present invention relates to a processing system capable of electro-coating, wet process surface finishing or plating vertically disposed substrates to produce printed circuits or other finished materials.

As shown in FIGS. 1 through 4, the preferred embodiment of the present invention is directed to a vertical processing system generally indicated as 10 to produce printed circuits on a continuous strip of substrate SS comprising a processing cabinet generally indicated as 12 having a entry opening 14 and a exit opening 16 formed on opposite ends thereof, a supply station generally indicated as 18 and a take-up station generally indicated as 20 disposed adjacent the entry opening 14 and the exit opening 16 respectively, a transport mechanism including a clip engagement station generally indicated as 22 and a clip release station generally indicated as 24 to transport the continuous strip of substrate SS from the supply station 18 through the entry opening 14, the processing cabinet 12 and the exit opening 16 to the take-up station 20. A system control 26 is provided to selectively control the tension and speed of the continuous strip of substrate SS traveling from the supply station 18 to the take-up station 20.

An electrical harness 28 extends from the system control 26 to the processing cabinet 12, the supply station 18, the take-up station 20 and a transport drive means generally indicated as 30 to house electrical and control wiring to provide electrical power in conventional fashion to the various electrically powered components and integrated computerized controls and monitoring signals to control and monitor the equipment and real time process parameters of the vertical processing system 10. In addition, a frame generally indicated as 32 extends substantially the length of the processing cabinet 12 to support the transport mechanism including the clip engagement station 22, the clip release station 24 and the transport drive means 30.

As best shown in FIGS. 1, 2, 9, and 13, the supply station 18 and the take-up station 20 also include a supply station control/distribution junction box and a take-up station control/distribution junction box indicated as 34 and 36 respectively coupled to the system control 26 by the electrical harness 28.

As best shown in FIGS. 1 through 4, the processing cabinet 12 comprises a preparation module, a processing module and a finishing module generally indicated as 110, 112 and 114 respectively disposed in end-to-end relationship relative to each other supported by a plurality of cabinet supports each indicated as 116.

As best shown in FIGS. 1 and 3, the preparation module 110 comprises a cleaning stage and a rinsing stage generally indicated as 118 and 120 respectively. The cleaning stage 118 and rinsing stage 120 may each include a conventional fluid circulating system and a plurality of fluid tubes disposed on opposite sides of the cleaning stage 118 and the rinsing stage 120 to apply liquid to the continuous strip of unprocessed substrate SS traversing through the preparation module 110.

As best shown in FIGS. 1 through 4, the processing module 112 comprises a plurality of processing zones each indicated as 122 having a bank of fluid spray tubes each indicated as 124 disposed on opposite sides thereof and within a pair of fluid retention side walls each indicated as 126 extending substantially the length of processing module 112 to cooperatively form a processing chamber 128 therebetween. The processing module 112 may include a fluid circulating system and reservoir similar to that disclosed in U.S. Pat. No. 5,211,756 to provide the processing fluid to the continuous strip of substrate SS transported through the processing module 112. A first and second fluid seal assembly generally indicated as 130 and 132 respectively are disposed adjacent an entry opening 134 and an exit opening 136 formed at opposite ends of the pair of substantially parallel fluid retention side walls 126 respectively to virtually retain the processing fluid within the processing chamber 128 as described more fully hereinafter.

Figure 2:
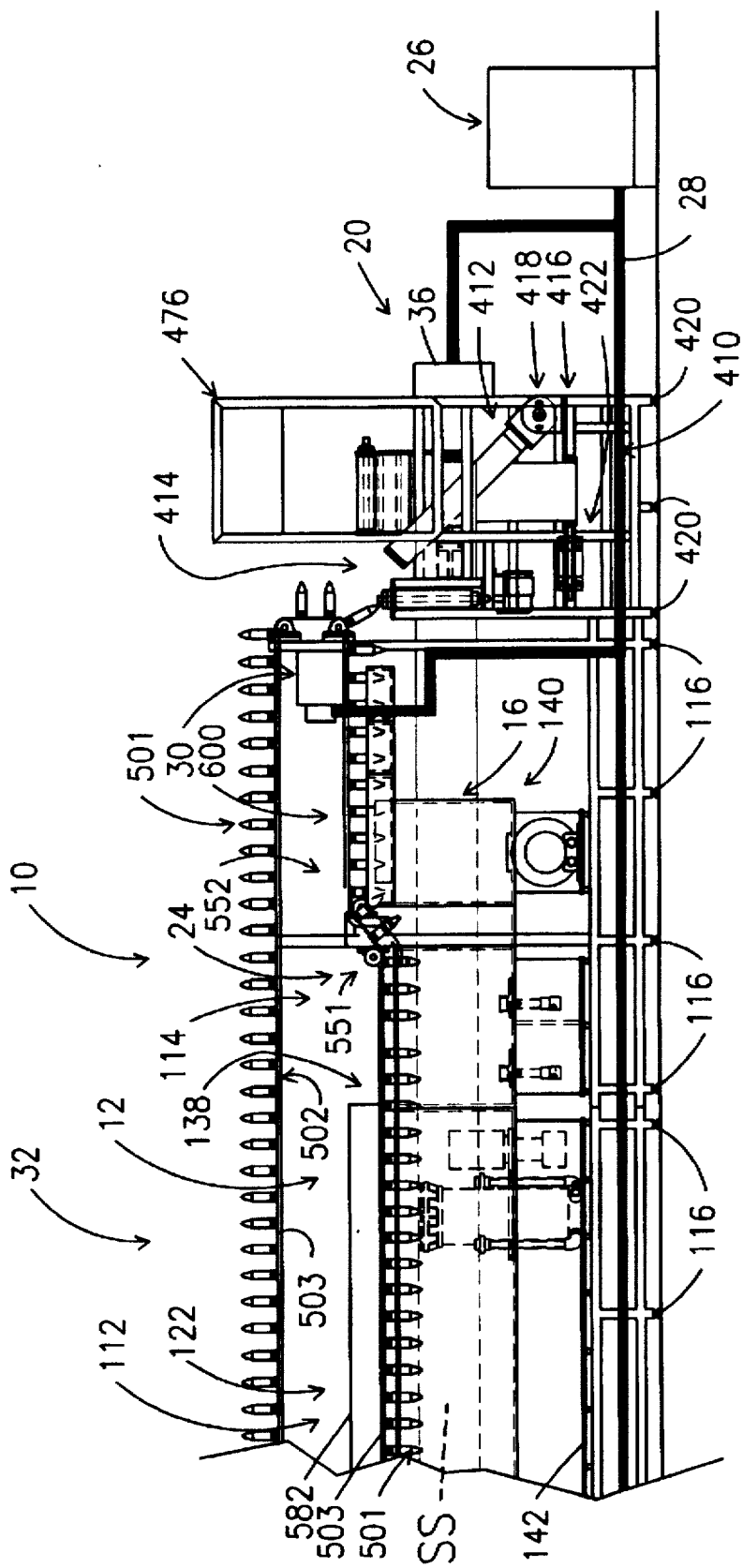
FIG. 2 is a partial side view of the vertical processing system of the present invention showing the take-up station.
Figure 5:
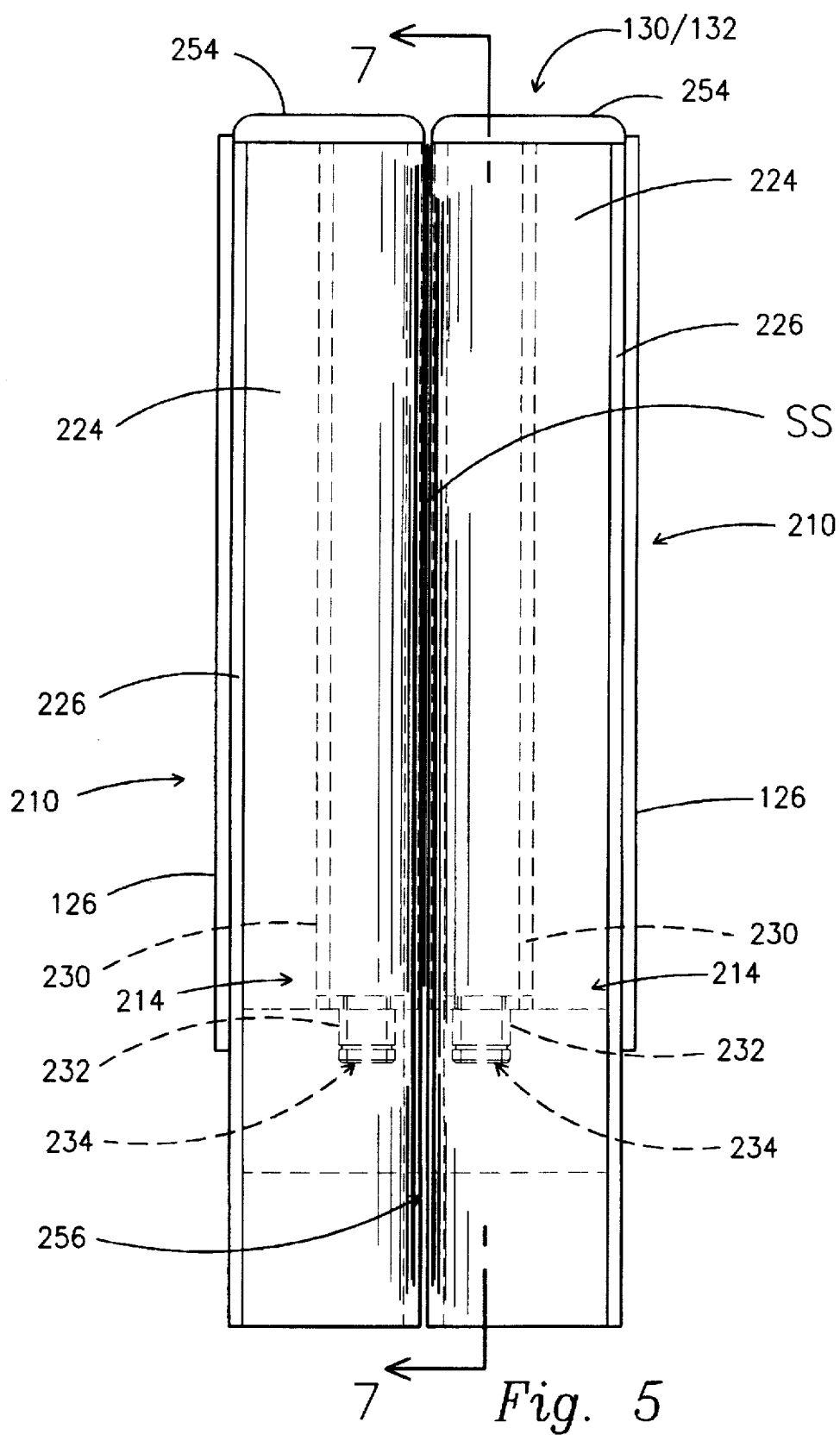
FIG. 5 is a front view of the fluid seal assembly of the present invention.
Figure 6:
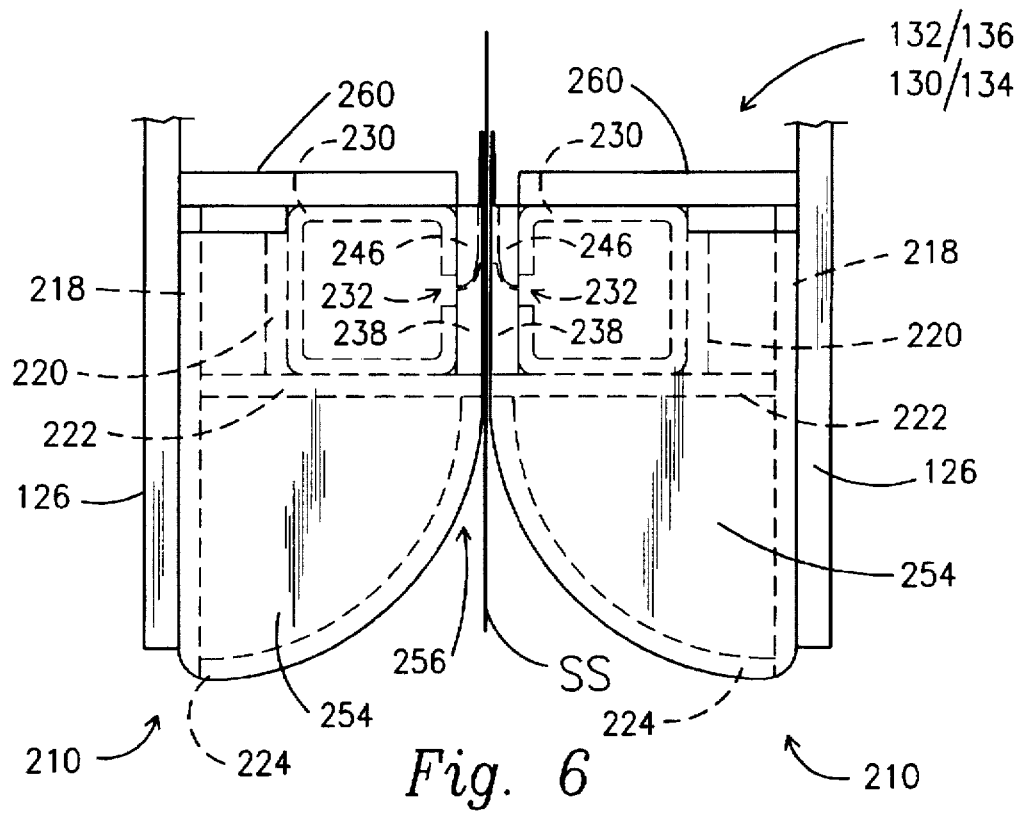
FIG. 6 is a top view of the fluid seal assembly of the present invention.

As best shown in FIGS. 2 and 4, the finishing module 114 comprises a rinsing stage and a drying stage generally indicated as 138 and 140 respectively. The rinsing stage 138 may comprise a reservoir, pump(s) to operatively supply fluid rinse to the surfaces of the continuous strip of processed substrate SS through a rinse fluid circulating system and a plurality of fluid rinse tubes as the continuous strip of processed substrate SS traverses therethrough. The drying stage 140 may comprise a dry blower operatively coupled to a plurality of drying tubes disposed on opposite sides thereof to dry the continuous strip of processed substrate SS traversing therethrough.

As best shown in FIGS. 3 and 4, a catwalk 142 may extend the entire length of the processing cabinet 12 to promote easy access thereto for operations and maintenance thereof.

As best shown in FIGS. 5 through 8, the first and second fluid seal assembly 130 and 132 each comprises a corresponding fluid seal element generally indicated as 210 attached to the end portion of each fluid retention side wall 126 such that the corresponding pair of fluid seal elements 210 disposed on each end portion of the processing chamber 128 cooperatively form a fluid seal to virtually seal the entry opening 134 and exit opening 136 as described more fully hereinafter.

Each fluid seal element 210 comprises a seal frame generally indicated 212 to mount each substantially vertical fluid seal element 210 to the end portion of the corresponding vertical fluid side wall 126, a fluid supply means generally indicated as 214 to provide sealing fluid to the first and second fluid seal assemblies 130 and 132 and a fluid directional control means generally indicated as 216 to direct the sealing fluid into the processing chamber 128.

Each seal frame 212 comprises a first and second seal frame member indicated as 218 and 220 respectively held in substantially parallel spaced relationship relative to each other by a third seal frame member 222 and an outer arcuate convex member 224 extending between the outer end 226 of the first seal frame member 218 and the outer end 228 of the third seal frame member 222.

Each fluid supply means 214 comprises a substantially vertical fluid supply tube 230 having a vertically disposed elongated outlet 232 extending substantially the length thereof coupled to a fluid source (not shown) by an inlet conduit 234 having an inlet port 236 formed therein.

Figure 8:
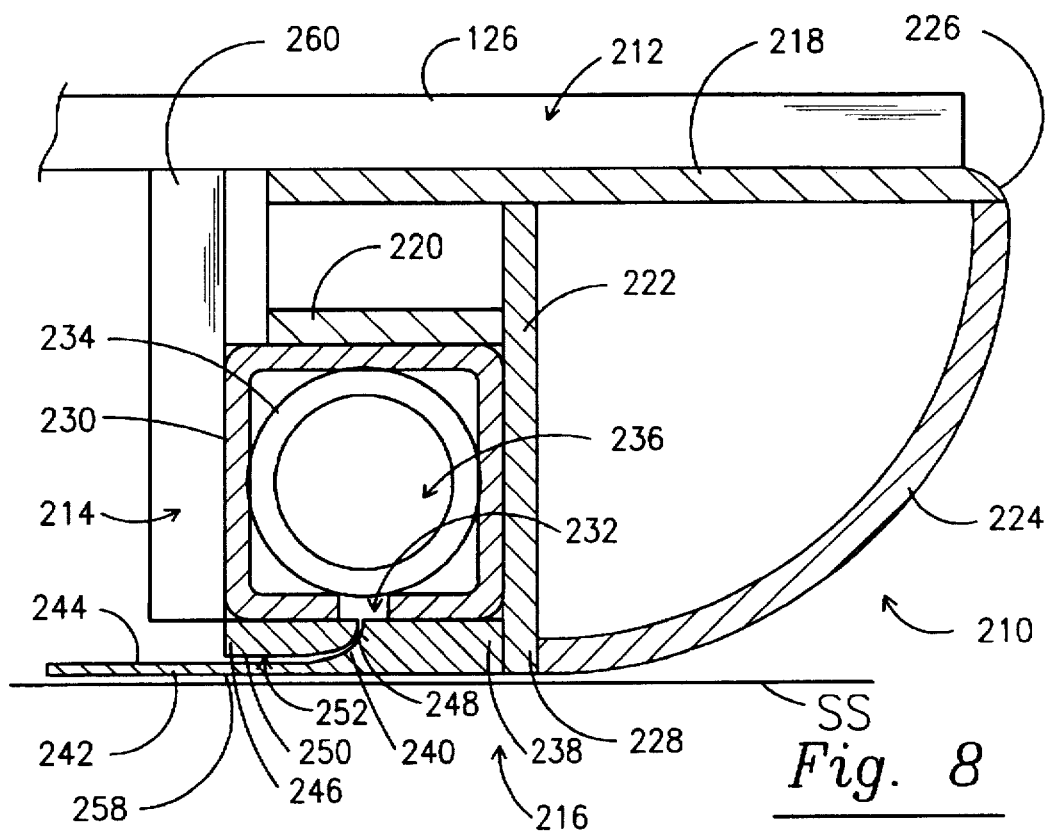
FIG. 8 is a cross-sectional top view of the fluid seal element of the fluid seal assembly of the present invention taken along lines 8—8 of FIG. 7.
Figure 7:
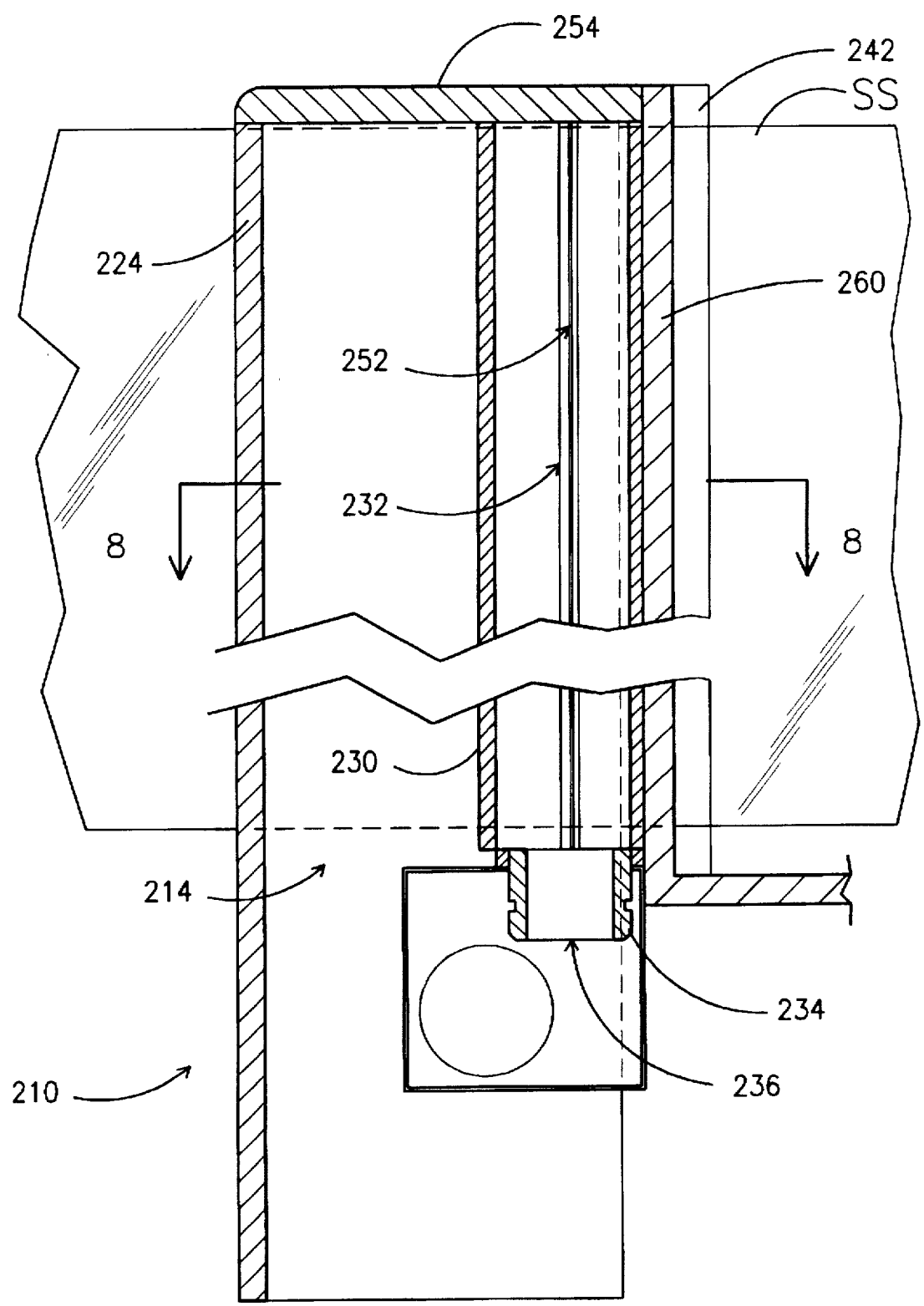
FIG. 7 is a cross-sectional side view of the fluid seal element of the fluid seal assembly of the present invention taken along line 7—7 of FIG. 5.

Each fluid directional control means 216 comprises a first fluid directional control member 238 including a concave surface 240 and a flange 242 including a first planar surface 244 extending outwardly therefrom and a second fluid directional control member 246 including a convex surface 248 disposed adjacent the concave surface 240 and a second planar surface 250 disposed in substantially parallel relationship relative to the first planar surface 244 such that the concave surface 240 and the convex surface 248 together with the first planar surface 244 and the second planar surface 250 cooperatively form a vertically disposed elongated fluid flow opening 252 to force solution or seal fluid into the processing chamber 128 creating a fluid barrier immediately adjacent each side of the continuous strip of substrate SS to retain the processing fluid therein. As best shown in FIG. 8, the first planar surface 244 of the first fluid directional control member 238 extends beyond the second planar surface 250 of the second fluid directional control member 246 to reduce cavitation of the sealing fluid.

A cap or top 254 is attached to the upper portion of each substantially vertical fluid seal element 210 to cause the sealing fluid from the fluid source (not shown) to flow through the vertically disposed elongated outlet 232 and the vertically disposed elongated fluid flow opening 252 into a substrate receiving slot 256 cooperatively formed between the a djacent o uter surfaces 258 of the adjacent first fluid direction control members 238 of the corresponding substantially vertical flui d seal elements 210 to receive the continuous strip of substrate SS therethrough. Corresponding vertically disposed elongated fluid flow openings 252 are directed toward the substrate receiving slot 256 on opposite sides of the continuous strip of substrate 128 creating a fluid barrier adjacent both the entry opening 134 and the exit opening 136 to virtually seal the processing fluid in the processing chamber 128.

Additional support for each substantially vertical fluid seal element 210 may be provided by a support member 260 extended between each end portion of each substantially parallel vertical fluid side wall 128 to engage the corresponding substantially vertical fluid supply tube 230.

Figure 9:
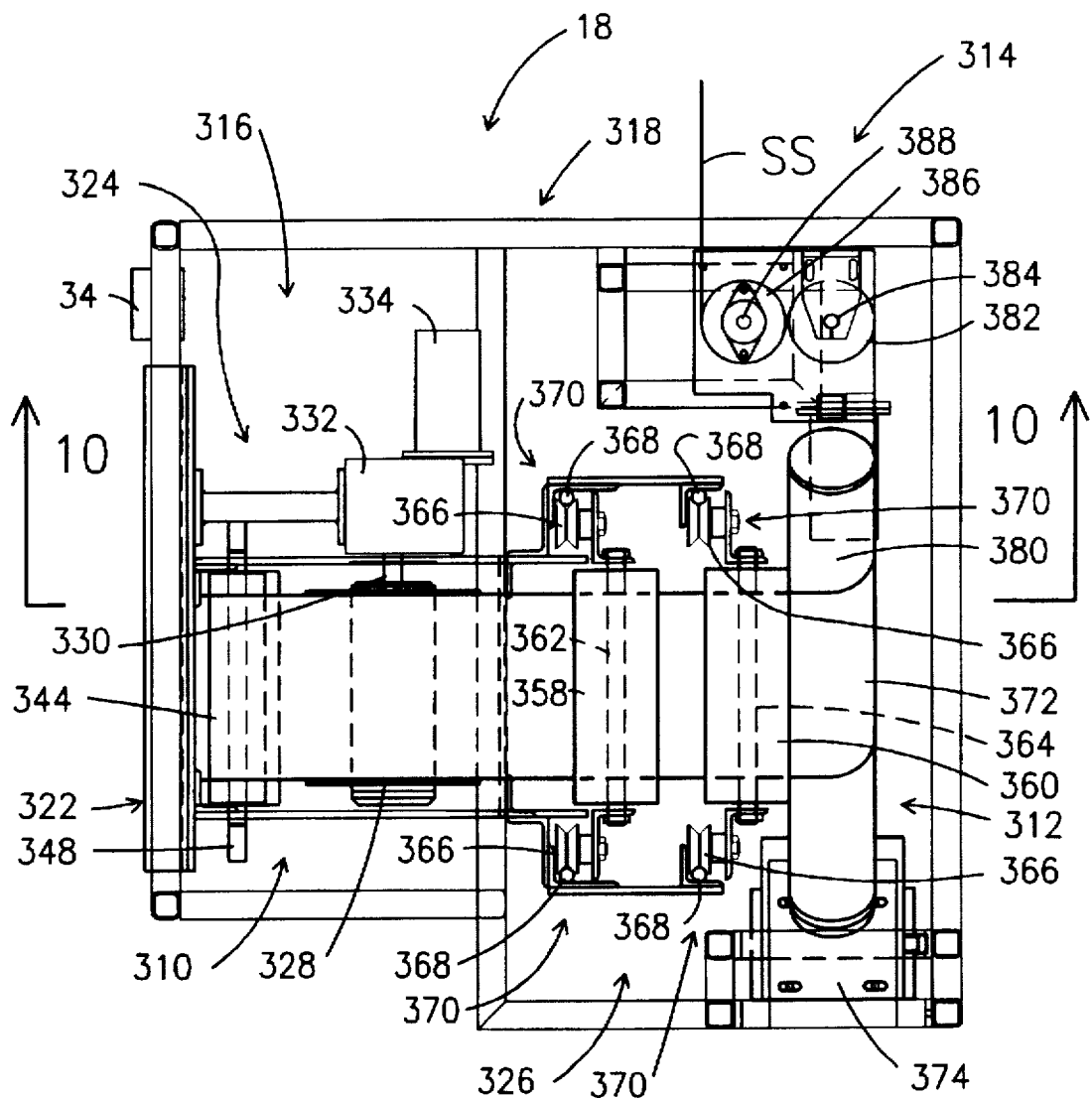
FIG. 9 is a top view of the supply station of the present invention.
Figure 10:
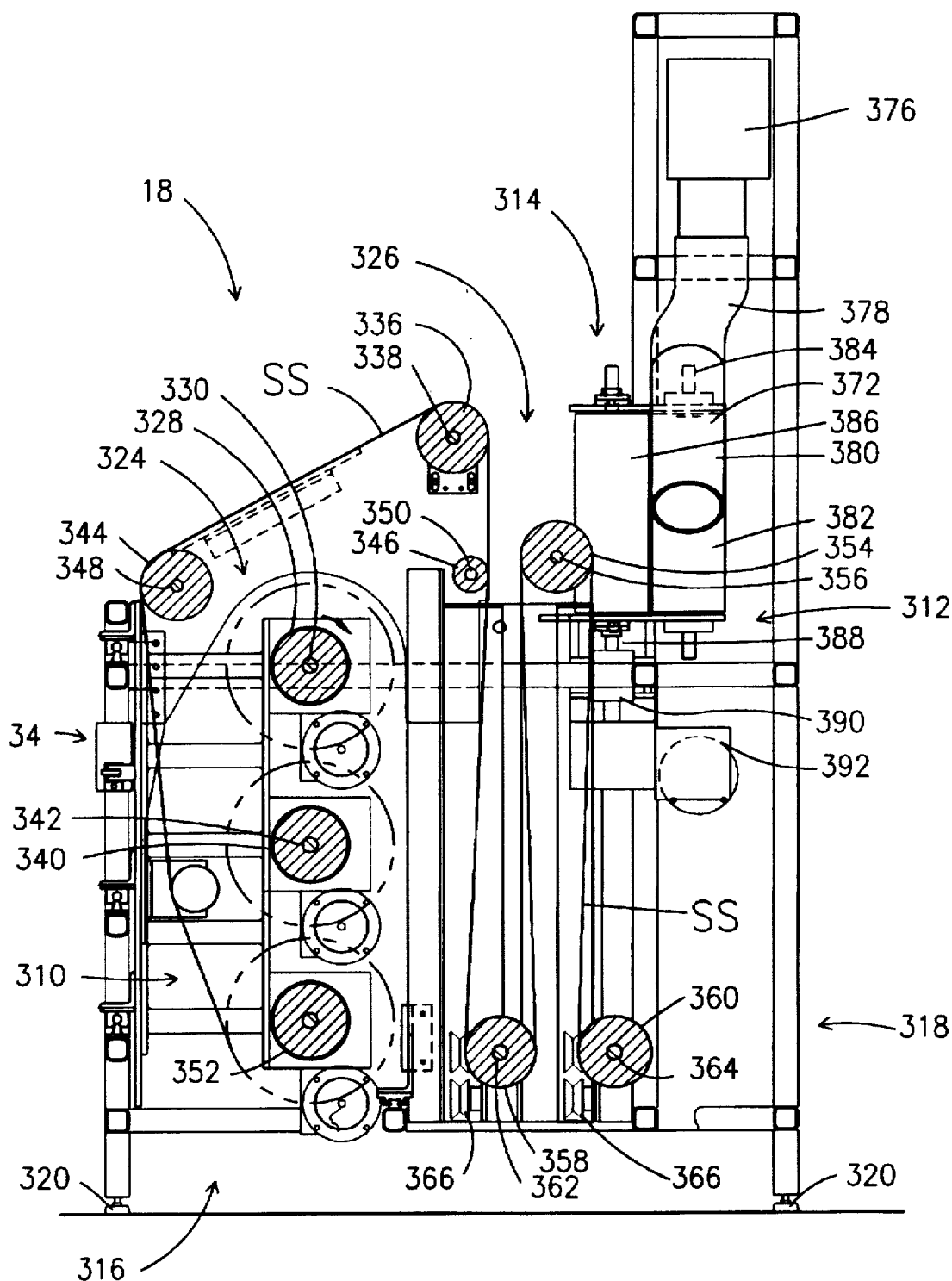
FIG. 10 is a cross-sectional end view of the supply station of the present invention taken along line 10—10 of FIG. 9.
Figure 12:
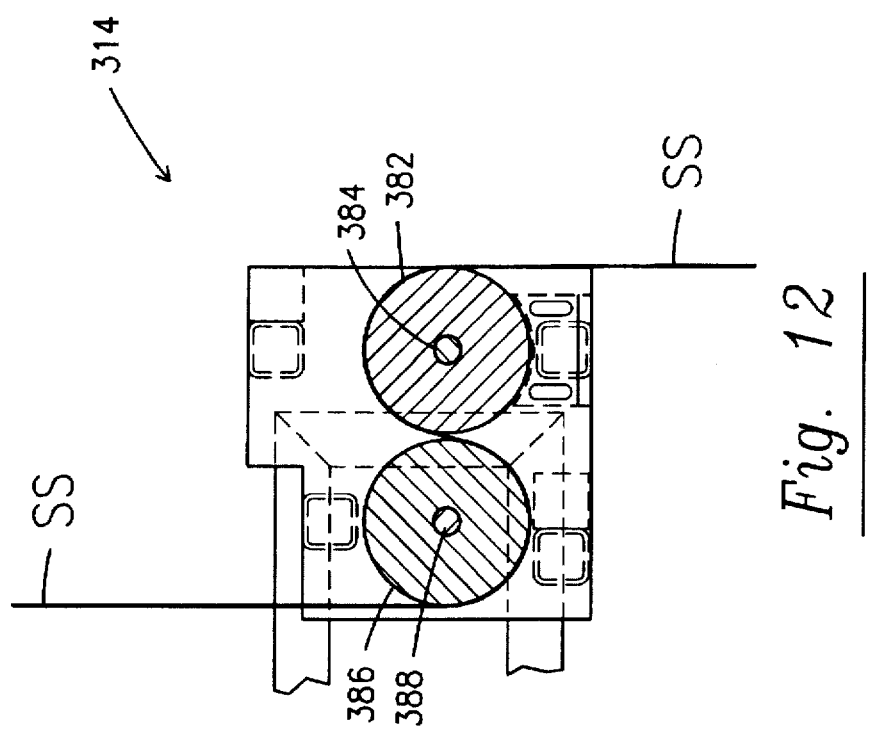
FIG. 12 is a cross-sectional top view of the feed assembly of the supply station of the present invention taken along line 12—12 of FIG. 11.
Figure 11:
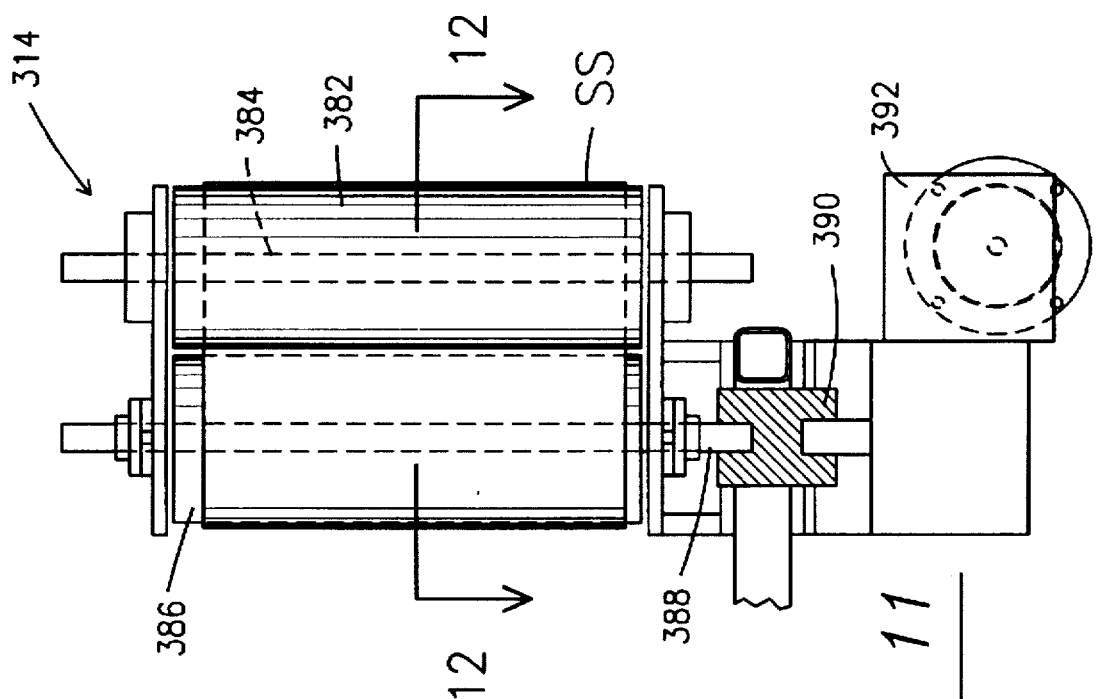
FIG. 11 is an end view of the feed assembly of the supply station of the present invention.

FIGS. 9 and 10 show the supply station 18 in detail. Specifically, the supply station 18 comprises a supply assembly generally indicated as 310 to supply a horizontally disposed continuous strip of unprocessed substrate SS, a supply directional change assembly generally indicated as 312 to translate or reposition the continuous strip of unprocessed substrate SS from the horizontal to vertical and a supply feed assembly generally indicated as 314 to feed the vertically disposed continuous strip of unprocessed substrate SS to the clip engagement station 22 each operatively mounted on a supply carriage generally indicated as 316 movably mounted on a stationary supply frame generally indicated as 318 which is supported on a plurality of supply frame supports each indicated as 320. The supply station 18 may further include a supply vertical adjustment assembly generally indicated as 322 operatively coupled between the supply carriage 316 and the stationary supply frame 318 to selectively adjust the vertical position of the continuous strip of unprocessed substrate SS relative to the clip engagement station 22. In addition, the supply station 18 may include a conventional splicing assembly.

The supply assembly 310 comprises a supply unwind section generally indicated as 324 and a supply accumulator section generally indicated as 326. The supply unwind section 324 comprises a horizontally disposed supply spindle 328 to supply a continuous strip of unprocessed substrate SS mounted on a horizontally disposed supply spindle shaft 330 extending outwardly from a supply gear reducer 332 coupled to a supply motor 334 attached to the supply carriage 316 and a horizontally disposed supply tension roller 336 rotatable mounted on the supply carriage 316 by a horizontally disposed supply tension roller shaft 338. A horizontally disposed supply interleaf roller 340 is rotatably mounted on the supply carriage 316 by a horizontally disposed supply interleaf roller shaft 342. A first and second horizontally disposed supply idler roller indicated as 344 and 346 respectively are rotatable mounted on the supply carriage 316 by a first and second horizontally disposed supply idler roller shaft indicated as 348 and 350 respectively disposed between the horizontally disposed supply spindle 328 and the horizontally disposed supply tension roller 336, and the horizontally disposed supply tension roller 336 and the supply accumulator section 326 respectively. In addition, a second horizontally disposed supply spindle 352 in combination with the supply accumulator section 326 and the splicing assembly permit continuous operation of the vertical processing system 10 by allowing a continuous strip of unprocessed substrate SS from the second horizontally disposed supply spindle 352 to be spliced onto the continuous strip of unprocessed substrate SS from the horizontally disposed supply spindle 328 during operation of the vertical processing system 10.

The supply accumulator section 326 comprises an upper horizontally disposed supply idler roller 354 rotatably mounted on the supply carriage 316 by an upper horizontally disposed supply idler roller shaft 356 and a first and second lower horizontally disposed supply accumulator roller indicated as 358 and 360 respectively rotatably mounted on the supply carriage 316 by a first and second lower horizontally disposed supply accumulator roller shaft indicated as 362 and 364 respectively connected at each end thereof to a corresponding roller or wheel 366 in operative engagement with a corresponding vertically disposed rail 368 disposed within a corresponding vertically disposed channel 370 to move vertically therein.

The supply directional change assembly 312 comprises a diagonally disposed hollow substantially cylindrical perforated member 372 attached to the supply platform 316 by a yoke 374 and a positive pressure air source 376 including an air blower and motor coupled to the diagonally disposed hollow substantially cylindrical perforated member 372 by an air supply conduit 378 to supply air to the interior of the diagonally disposed hollow substantially cylindrical perforated member 372 to create an air cushion on the outer surface 380 thereof such that the diagonally disposed hollow substantially cylindrical perforated member 372 acts as an air bearing to alter or change the disposition of the continuous strip of unprocessed substrate SS from the horizontal when exiting the supply assembly 310 to the vertical when entering the supply feed assembly 314.

As shown in FIGS. 9 through 12, the supply feed assembly 314 comprises a vertically disposed supply feed idler roller 382 rotatably mounted on the supply carriage 316 by a vertically disposed supply feed idler roller shaft 384 and a vertically disposed supply feed roller 386 mounted on a vertically disposed supply feed shaft 388 extending outwardly from a supply feed gear reducer 390 coupled to a supply feed motor 392 attached to the supply carriage 316 to feed the continuous strip of unprocessed substrate SS into the processing cabinet 12 through the entry opening 14.

Figure 13:
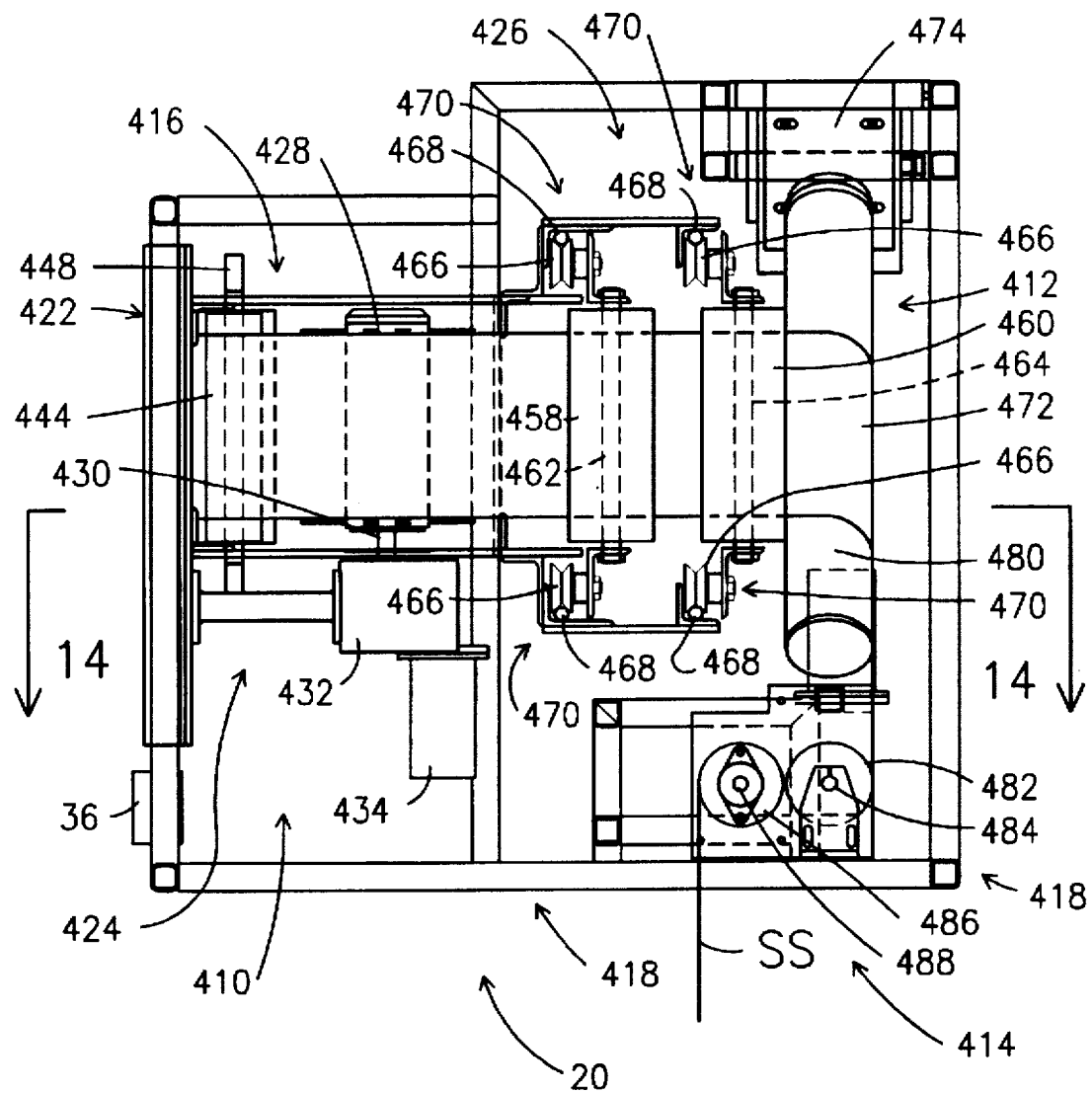
FIG. 13 is a top view of the take-up station of the present invention.
Figure 14:
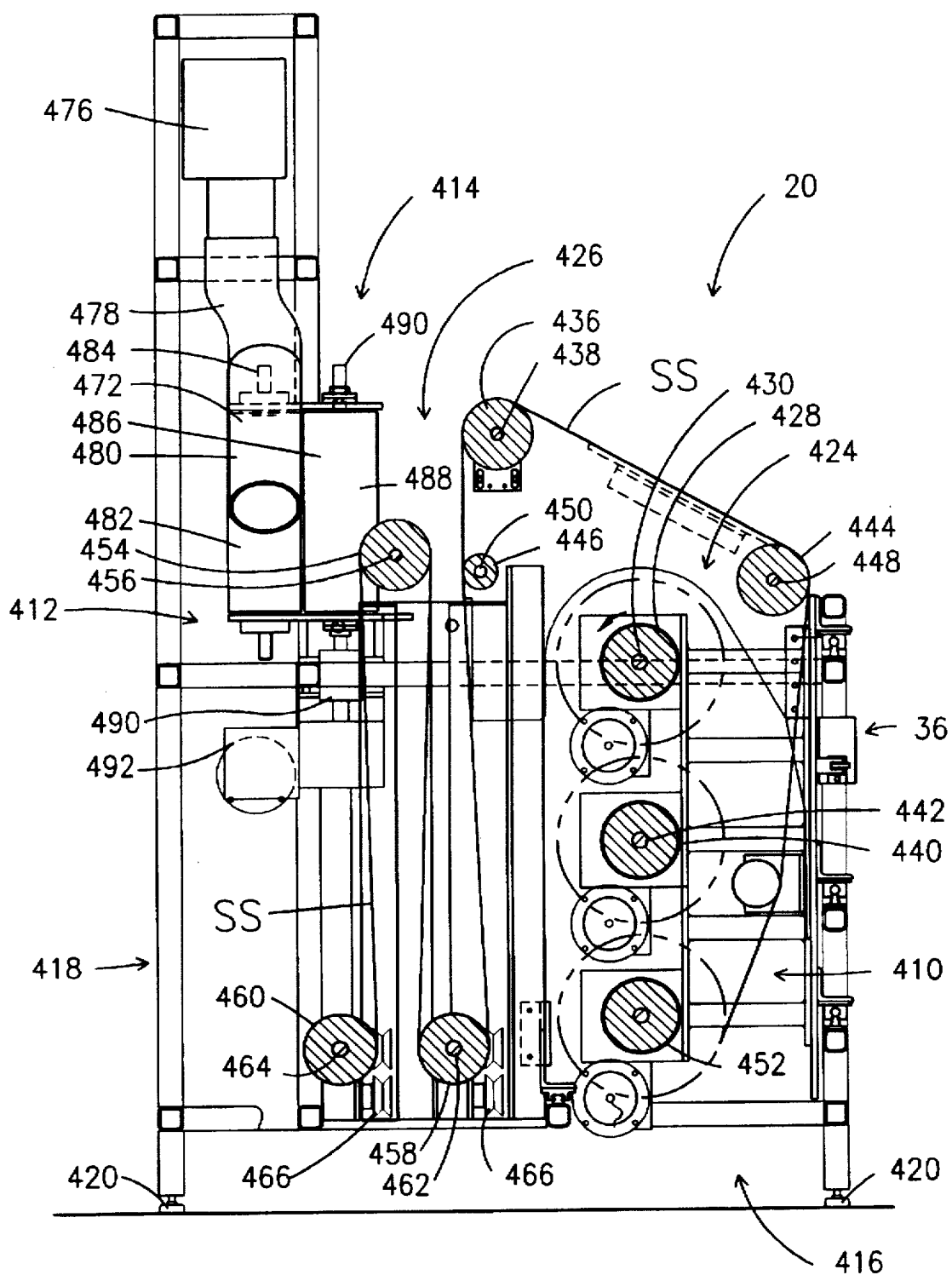
FIG. 14 is a cross-sectional end view of the take-up station of the present invention taken along line 14—14 of FIG. 13.

FIGS. 13 and 14 show the take-up station 20 in detail. Specifically, the take-up station 20 comprises a take-up assembly generally indicated as 410 to retrieve the horizontally disposed continuous strip of processed substrate SS from a take-up directional change assembly generally indicated as 412 to translate or reposition the continuous strip of processed substrate SS from the vertical to horizontal operatively mounted on a take-up carriage generally indicated as 416 movably mounted on a stationary take-up frame generally indicated as 418 supported on a plurality of take-up frame supports each indicated as 420 and a take-up adjustment assembly generally indicated as 422 operatively coupled between the take-up carriage 416 and the stationary take-up frame 418 to permit relative movement therebetween. A take-up retrieval assembly generally indicated as 414 is operatively mounted on the stationary film take-up frame 418 to receive the vertically disposed continuous strip of processed substrate SS from the clip release station 24. In addition, the supply station 18 may include a conventional splicing assembly.

The take-up assembly 410 comprises a take-up rewind section generally indicated as 424 and a take-up accumulator section generally indicated as 426. The take-up rewind section 424 comprises a horizontally disposed take-up spindle 428 to receive the continuous strip of processed substrate SS mounted on a horizontally disposed take-up spindle shaft 430 extending outwardly from a take-up gear reducer 432 coupled to a take-up motor 434 attached to the take-up carriage 416 and a horizontally disposed take-up tension roller 436 rotatably mounted on the take-up carriage 416 by a horizontally disposed take-up tension roller shaft 438. A horizontally disposed take-up interleaf roller 440 is rotatably mounted on the take-up carriage 416 by a horizontally disposed take-up interleaf roller shaft 442. A first and second horizontally disposed take-up idler roller indicated as 444 and 446 respectively are rotatably mounted on the take-up carriage 416 by a first and second horizontally disposed take-up idler roller shaft indicated as 448 and 450 respectively disposed between the horizontally disposed take-up spindle 428 and the horizontally disposed take-up tension roller 436, and the horizontally disposed take-up tension roller 436 and the take-up accumulator section 426 respectively. In addition, a second horizontally disposed take-up spindle 452 in combination with the take-up accumulator section 426 and the splicing assembly permit continuous operation of the vertical processing system 10 by allowing a continuous strip of processed substrate SS to be be spliced onto the continuous strip of processed substrate SS from the horizontally disposed take-up spindle 428 during operation of the vertical processing system 10.

The take-up accumulator section 426 comprises an upper horizontally disposed take-up idler roller 454 rotatably mounted on the take-up carriage 416 by an upper horizontally disposed take-up idler roller shaft 456 and a first and second lower horizontally disposed take-up accumulator roller indicated as 458 and 460 respectively rotatable mounted on the take-up carriage 416 by a first and second lower horizontally disposed take-up idler roller shaft indicated as 462 and 464 respectively connected at each end thereof to a corresponding roller or wheel 466 in operative engagement with a corresponding vertically disposed rail 468 disposed within a corresponding vertically disposed channel 470 to move vertically therein.

The take-up directional change assembly 412 comprises a diagonally disposed hollow substantially cylindrical perforated member 472 attached to the take-up carriage 416 by a yoke 474 and a positive pressure air source 476 including an air blower and motor coupled to the diagonally disposed hollow substantially cylindrical perforated member 472 by an air supply conduit 478 to supply air to the interior of the diagonally disposed hollow substantially cylindrical perforated member 472 to create an air cushion on the outer surface 480 thereof such that the diagonally disposed hollow substantially cylindrical perforated member 472 acts as an air bearing to alter or change the disposition of the continuous strip of processed substrate SS from the vertical when received by the take-up retrieval assembly 414 to the horizontal when entering the take-up rewind assembly 410.

As shown in FIGS. 13 through 16, the take-up retrieval assembly 414 comprises a vertically disposed take-up retrieval idler roller 482 rotatably mounted on the stationary take-up frame 418 by a vertically disposed take-up retrieval idler roller shaft 484 and a vertically disposed take-up retrieval roller 486 mounted on a vertically disposed take-up retrieval shaft 488 extending outwardly from a take-up retrieval gear reducer 490 coupled to a take-up retrieval motor 492 attached to the stationary take-up frame 418 to receive the continuous strip of processed substrate SS from the processing cabinet 12 through the film exit opening 16 and the clip release station 24.

Figure 20:
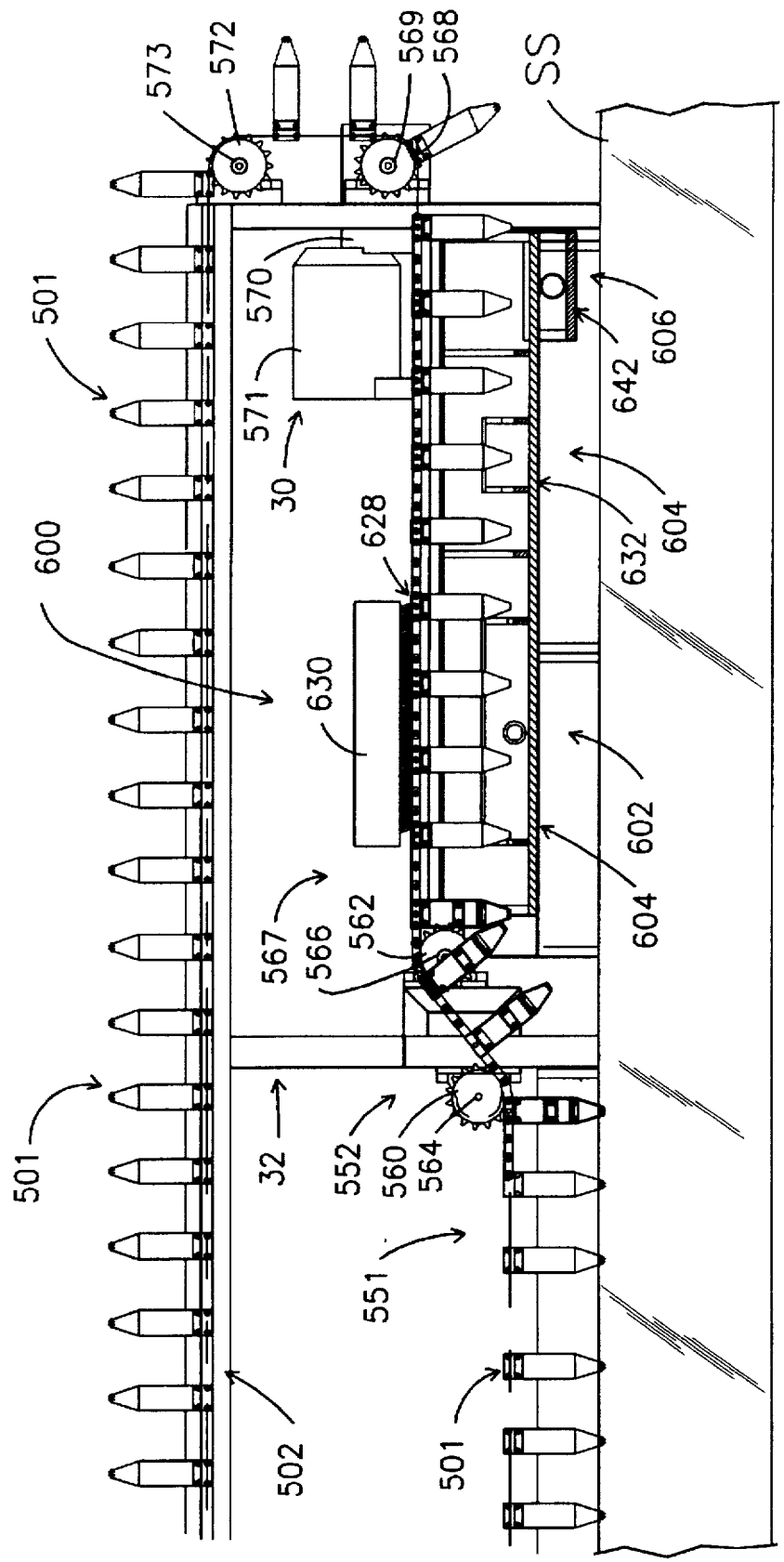
FIG. 20 is a partial side view of the vertical processing system of the present invention showing the clip release station and the clip stripping station.

As best shown in FIGS. 1, 2 and 20, the transport mechanism includes a plurality of clips each generally indicated as 501 attached to a continuous link chain generally indicated as 502 and similarity constructed upper and lower substantially horizontal chain guides or rails each indicated as 503 including a chain groove 504 formed therein to receive the continuous link chain 502. The upper and lower substantially horizontal chain guides or rails 503 are affixed to the frame 32 in conventional fashion extending between the clip engagement station 22, the clip release station 24 and the transport drive means 30.

Figure 17:
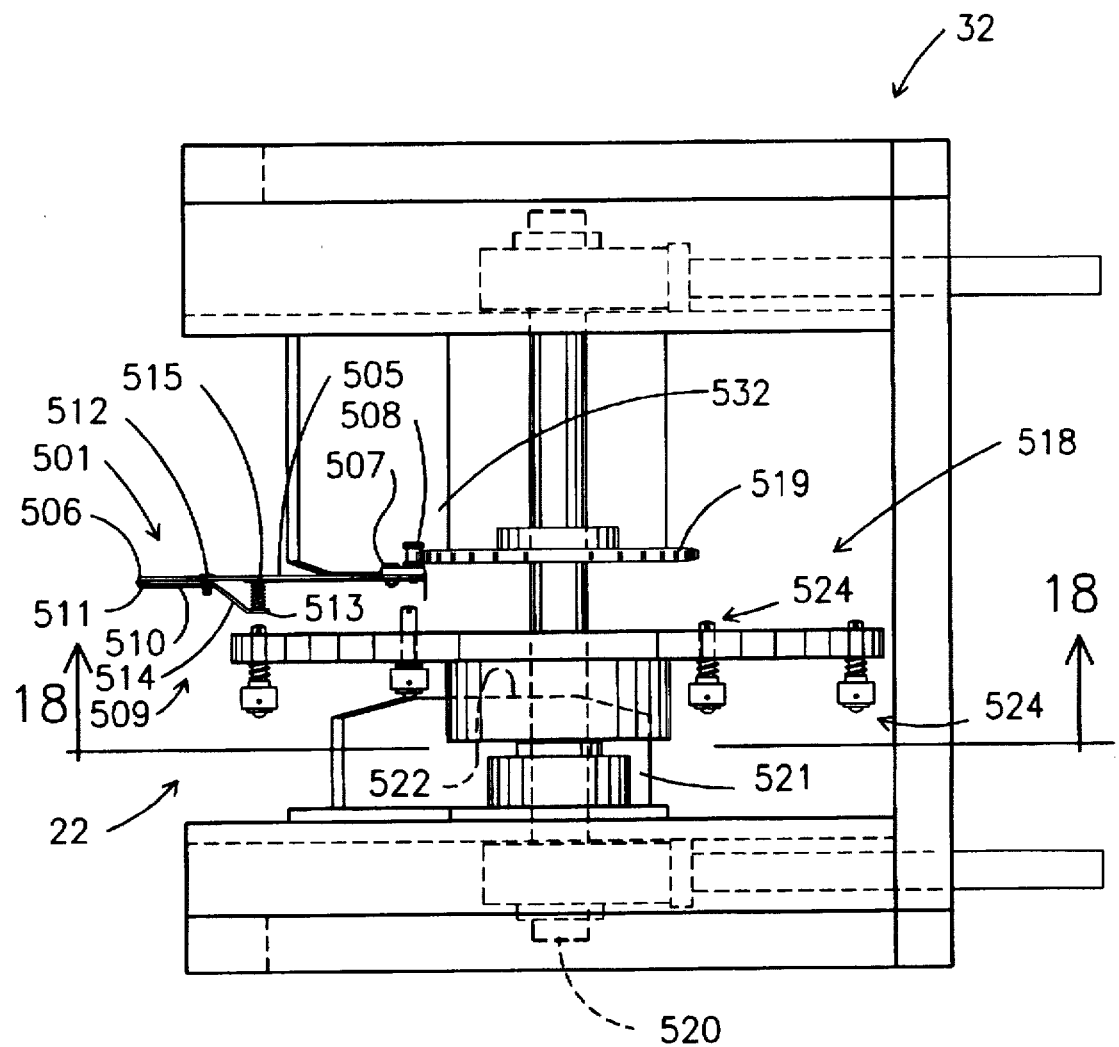
FIG. 17 is a top view of the clip engagement station of the present invention taken along line 17—17 of FIG. 1.
Figure 18:
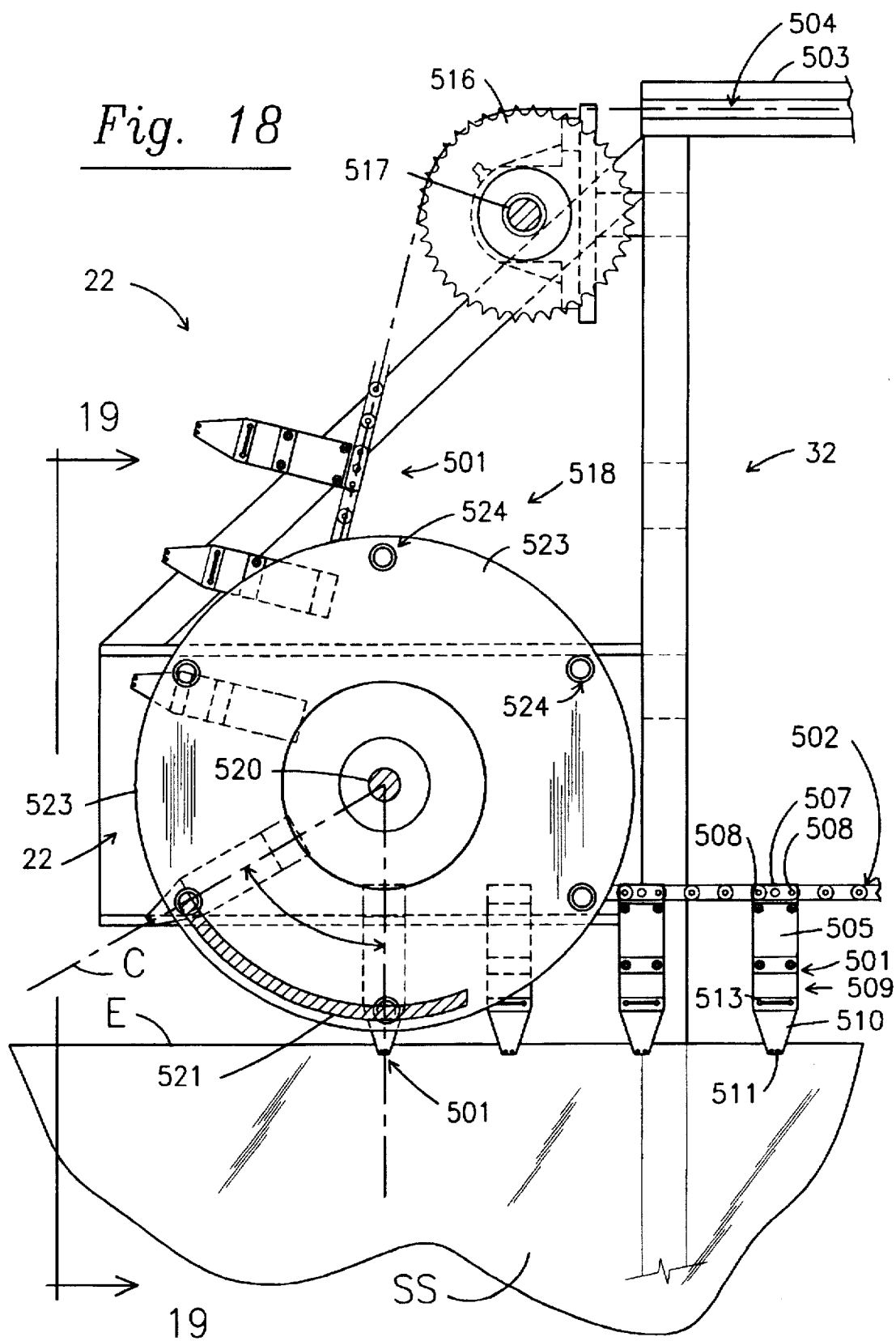
FIG. 18 is a cross-sectional side view of the clip engagement station of the present invention taken along line 18—18 of FIG. 17.
Figure 19:
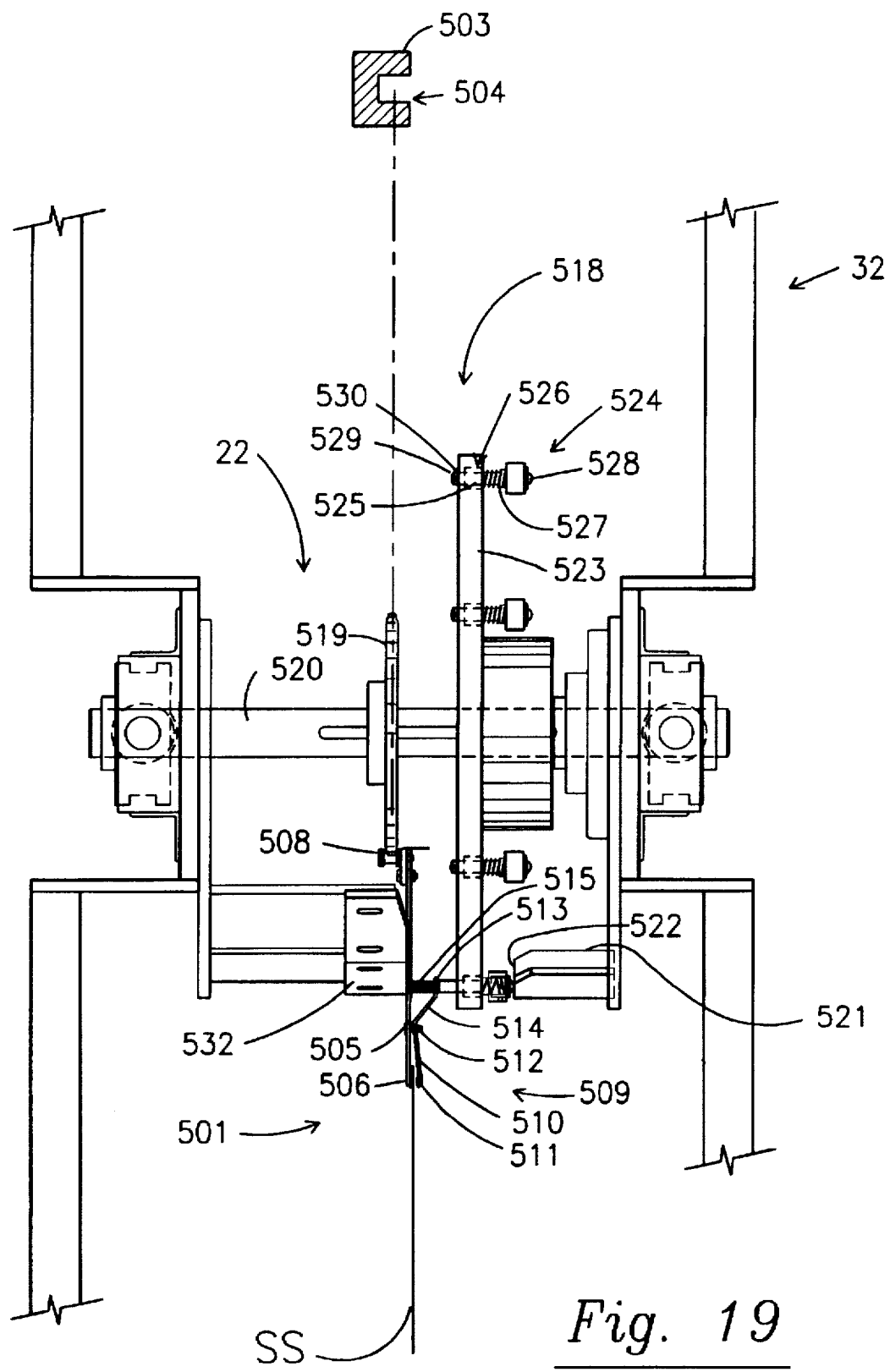
FIG. 19 is an end view of the clip engagement station of the present invention taken along line 19—19 of FIG. 18.

As shown in FIGS. 17 through 19, each clip 501 comprises a flat back member 505 including a first clamping tip 506 attached to a corresponding link 507 of the continuous link chain 502 by a pair of chain link pins each indicated as 508 and an angled clamping element generally indicated as 509 selectively movable between a first or closed position and a second or open position to selectively engage and release the continuous strip of substrate SS at the clip engagement station 22 and clip release station 24 respectively. The angled clamping element 509 comprises a flat clamping member 510 including a second clamping tip 511 pivotally attached to the flat back member 505 by a pivot means or pin 512 and a cam engaging member 513 connected to the flat clamping member 510 by an inclined interconnecting member 514. A spring or bias 515 is disposed between the flat back member 505 and the cam engaging member 513 to maintain each clip 501 in the first or normally closed position with the first and second clamping tips 506 and 511 in operative engagement relative to each other. When so disposed, the cam engaging member 513 is substantially parallel to the flat back member 505 and the flat clamping member 510.

As shown in FIGS. 17 through 19, an upper vertically disposed directional change sprocket 516 rotatable coupled to the frame 32 by a horizontally disposed sprocket shaft 517 directs the continuous link chain 502 to the film engagement station 22. The clip engagement station 22 comprises a cam element generally indicated as 518 and a lower vertically disposed engagement station sprocket 519 rotatable coupled to the frame 32 by a horizontally disposed engagement station cam shaft 520 and a cam plate 521 attached to a portion of the frame 32 and having a cam surface 522 formed on the inner face thereof disposed to selectively engage a portion of the cam element 518 as described more fully hereinafter to open and close the individual clips 501 traversing the clip engagement station 22 to grasp or clamp the upper edge E of the continuous strip of unprocessed substrate SS between corresponding first and second clamping tips 506 and 511 as best shown in FIGS. 18 and 19.

The cam element 518 comprises a substantially circular vertically disposed cam wheel or cam member 523 affixed to the horizontally disposed engagement station cam shaft 520 having a plurality of engagement station cam actuators each generally indicated as 524 mounted to the outer periphery thereof. Each engagement station cam actuator 524 comprises a substantially cylindrical horizontally disposed cam rod 525 selectively movable between a first and second position extending through a corresponding cam rod aperture 526 formed through the substantially circular vertically disposed cam wheel or cam member 523 normally biased in the first position by a bias or spring 527.

Each substantially cylindrical horizontally disposed cam rod 525 includes a first camming surface 528 and a second camming surface 529 formed on opposite ends thereof to selectively engage the cam surface 522 of the cam plate 521 and the cam engaging member 513 of the angled clamping element 509 respectively to open the clips 501 traveling through the clip engagement station 22 to permit the clamping or grasping of the upper edge E of the continuous strip of substrate SS for transport through the processing cabinet 12. Specifically, as the lower vertically disposed engagement station sprocket 519 and the substantially circular vertically disposed cam wheel or cam member 523 rotate together on the horizontally disposed engagement station shaft 520, the individual clips 501 travel downwardly through the camming zone CZ toward the continuous strip of unprocessed substrate SS as best shown in FIG. 18. When in the camming zone CZ and as the individual clips 501 near the upper edge E of the continuous strip of unprocessed substrate SS, each clip 501 is axially aligned with a corresponding engagement station cam actuator 524. So aligned, the first camming surface 528 of the engagement station cam actuator 524 engages the cam surface 522 of the cam plate 521 moving the substantially cylindrical horizontally disposed cam rod 525 from the first position to the second position to engage the cam engagement member 513 of the corresponding clip 501 rotating or pivoting the angled clamping element 509 from the first or closed position to the second or open position separating the second clamping tip 511 relative to the corresponding first clamping tip 506 such that the upper edge E of the continusos strip of unprocessed substrate SS is disposed therebetween as the clip 501 and the corresponding engagement station cam actuator 524 traverse the camming zone CZ. As the clip 501 approaches the vertical or 180° degree position, the first camming surface 528 disengages from the cam surface 522 of the cam plate 521 causing the substantially cylindrical horizontally disposed cam rod 525 to move from the second position to the first position under the force of the spring or bias 527 causing the second camming surface 529 to disengage from the cam engagement member 513 such that the angled clamping element 509 moves from the second or open position to the first or closed position under the force of the spring or bias 515 whereby the first and second clamping tips 506 and 511 grasp or clamp the upper edge E of the continuous strip of unprocessed substrate SS therebetween for transport through the processing cabinet 12 and to the clip release station 24. Since movement of each clip 501 and the corresponding engagement station cam actuator 524 is synchronized when traversing the camming zone CZ, there is no sliding movement therebetween.

A lock ring 530 or similar means may be used to retain substantially cylindrical horizontally disposed cam rods 525 in the corresponding cam rod apertures 526. Further, a back member stabilizer element 532 may be provided to engage the flat back members 505 to limit horizontal movement thereof as the flim clips 501 traverse the camming zone CZ.

As shown in FIGS. 2 and 20 through 23, the clip release station 24 comprises a clip release camming section generally indicated as 551 to open the clips 501 traversing therethrough and a clip release directional transition section generally indicated as 552 to move the clips 501 vertically away from the continuous strip of processed substrate SS before the individual clips 501 close to prevent reengagement therebetween.

Figure 21:
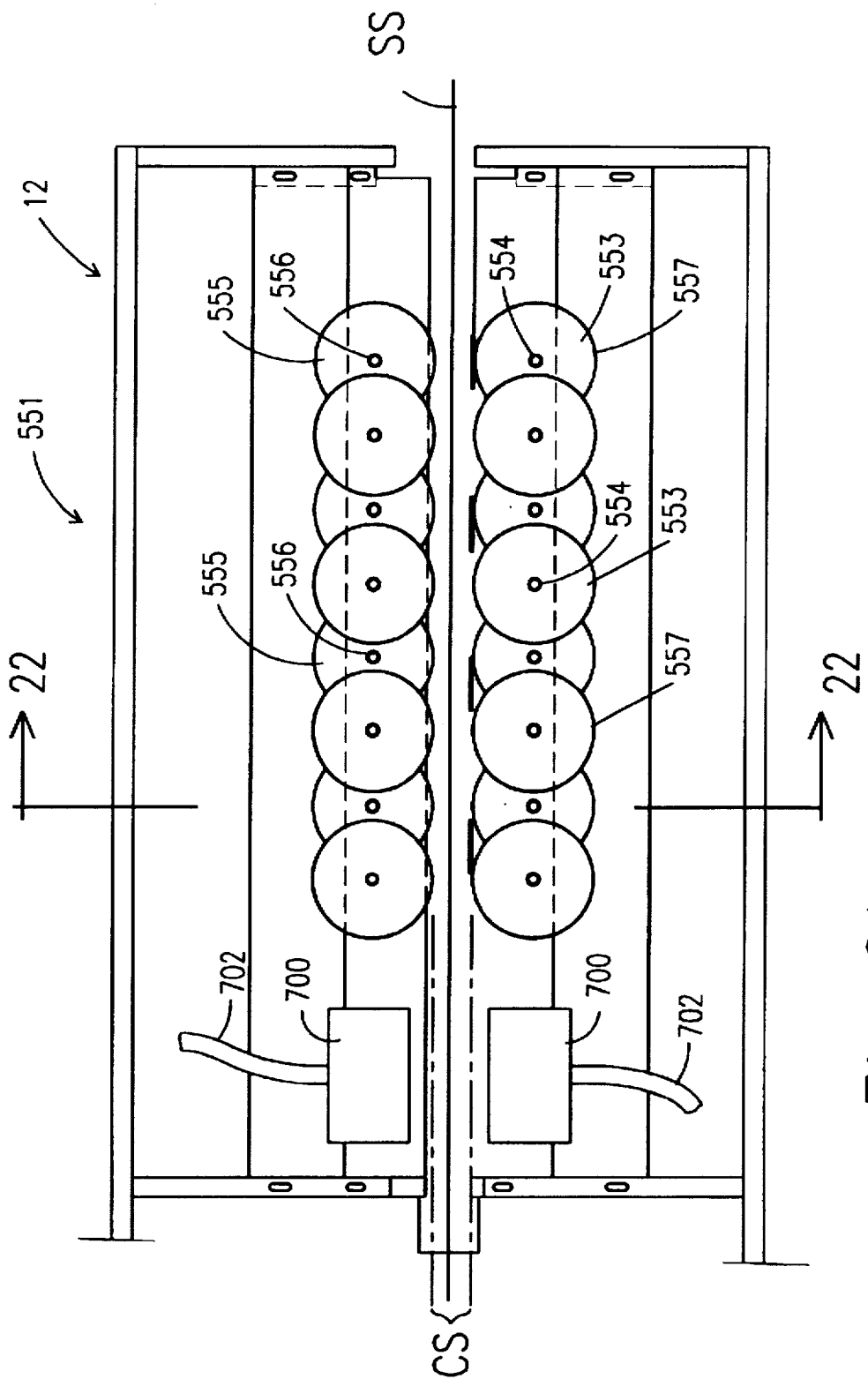
FIG. 21 is a top view of the clip camming section of the clip release station of the present invention.
Figure 22:
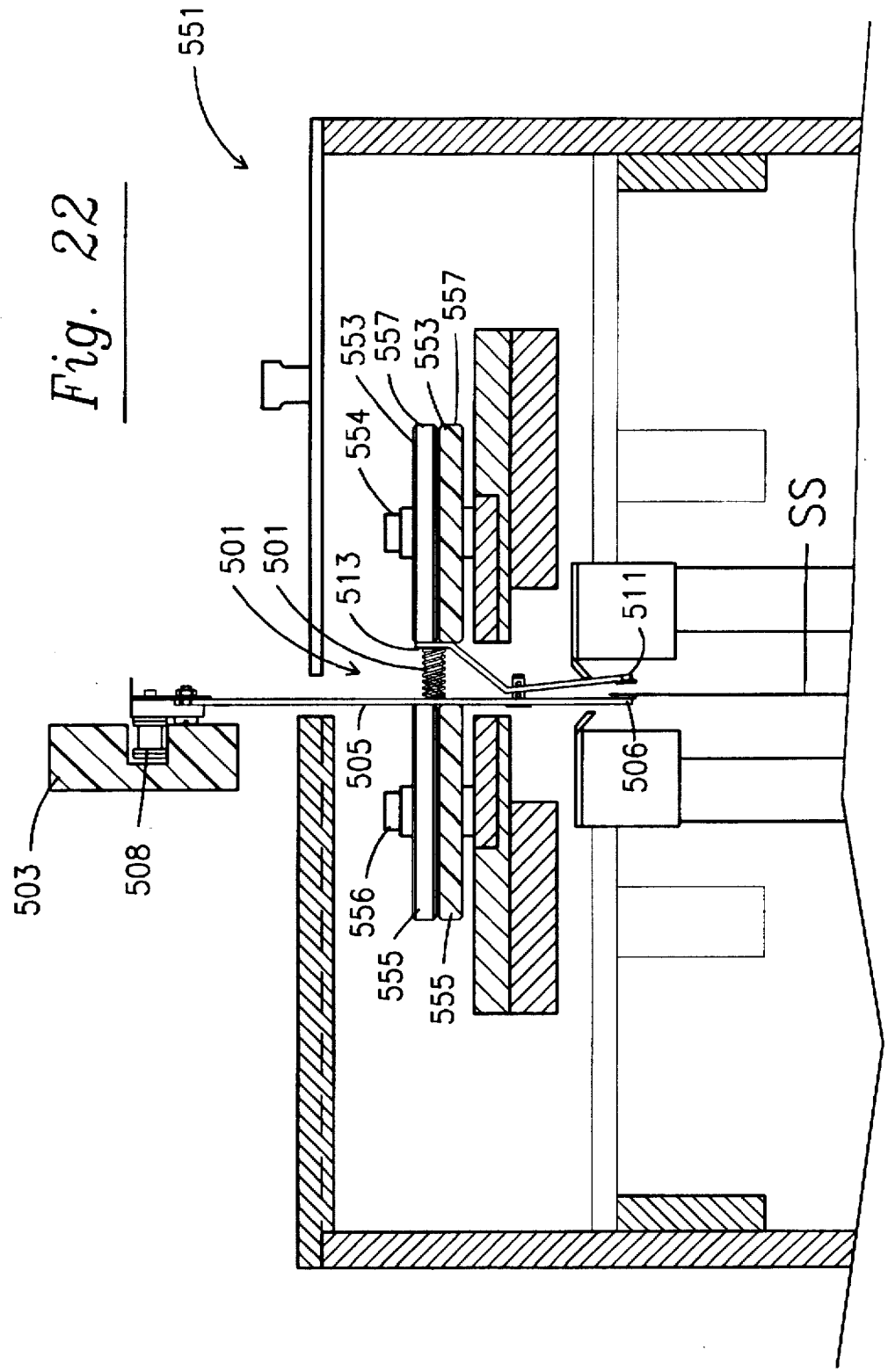
FIG. 22 is a cross-sectional end view of the clip release camming section of the clip release station of the present invention taken along line 22—22 of FIG. 21.

As best shown in FIGS. 21 and 22, the clip release camming section 551 comprises a plurality of horizontally disposed release station cam members or disks each indicated as 553 rotatable coupled to a portion of the processing cabinet 12 by a corresponding plurality of vertically disposed cam pins each indicated as 554 disposed adjacent the longitudinally centerline of the processing cabinet 12 to engage cam engaging members 513 of the clips 501 traversing the clip camming section 551 as described more fully hereinafter. Adjacent horizontally disposed release station cam members or disks 553 overlap relative to each other to create a constant line of contact with the cam engaging member 513 of each clip 501 traversing the clip release camming section 551. A plurality of horizontally disposed release section back stabilizer members or disks each indicated as 555 corresponding to the plurality of horizontally disposed release station cam members or disks 553 are rotatably coupled to a portion of the processing cabinet 12 by a corresponding plurality of vertically disposed back stabilizer pins each indicated as 556 disposed adjacent the opposite side of the longitudinally centerline of the processing cabinet 12 from the horizontally disposed release station cam members or disks 553 to engage the flat back members 505 of the clips 501 traversing the clip release camming station 551. Adjacent horizontally disposed release section back stabilizer members or disks 555 overlap relative to each other to create a constant line of contact with the flat back member 505 of each clip 501 traversing the clip release camming section 551.

Each horizontally disposed release station cam member or disk 553 includes a camming surface 557 to selectively engage the cam engaging member 513 of the angled clamping element 509 to open the clips 501 traversing the clip release station 24 to release the edge E of the continuous strip of processed substrate SS from the clips 501 before exiting the processing cabinet 12. Specifically as the clips 501 travel horizontally through the camming slot CS formed through the clip release camming section 551, the camming surfaces 557 of the horizontally disposed release station cam members or disks 553 engage the cam engagement member 513 of the corresponding clip 501 rotating or pivoting the angled clamping elements 509 from the first or closed position to the second or open position separating the second clamping tip 511 relative to the corresonding first clamping tip 506 while the upper edge E of the continuous strip of processed substrate SS is still disposed therebetween as each clip 501 traverses the clip release camming section 551. As each clip 501 approaches the exit of the clip release camming section 551 in the first or open position, the individual clips 501 are transported diagonally upward away from the edge E of the continuous strip of processed substrate SS by the clip release directional transition section 552 before the camming surfaces 557 disengage from the corresponding cam engagement members 513 such that the angled clamping elements 509 move from the second or open position to the first or closed position under the force of the corresponding springs or bias 515 whereby the corresponding first and second clamping tips 506 and 511 reengage without grasping or clamping the upper edge E of the continuous strip of processed substrate SS therebetween.

Figure 23:
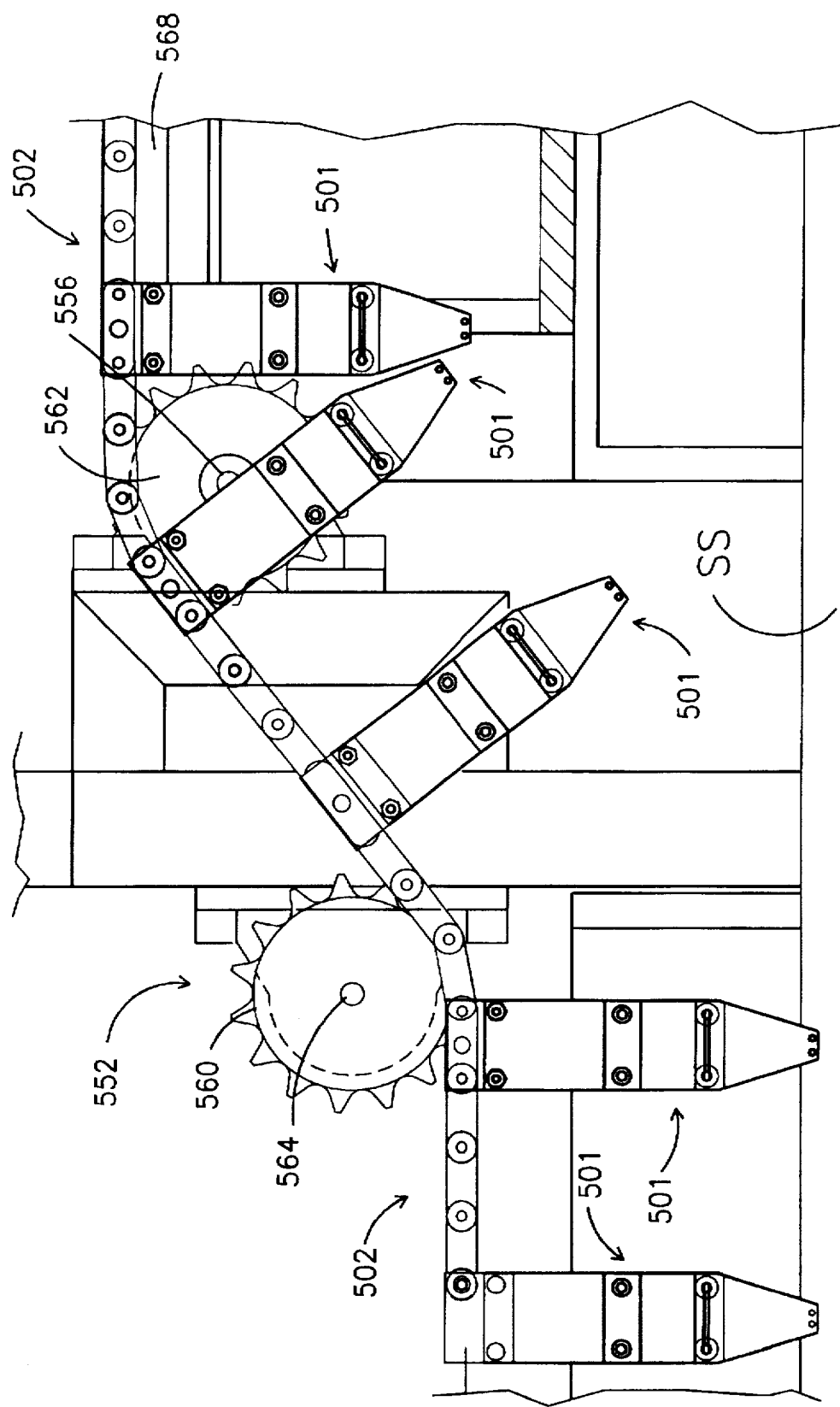
FIG. 23 is a detailed side view of the clip release directional transition section of the clip release station of the present invention.

As best shown in FIGS. 20 and 23, the clip release directional transition section 552 comprises a first and second vertically disposed release sprocket indicated as 560 and 562 respectively rotatably coupled to the frame 32 by a first and second horizontally disposed release sprocket shaft indicated as 564 and 566 respectively disposed to transport the continuous link chain 502 and the clips 501 from the clip release camming section 551 to the transport drive means 30 on an intermediate substantially horizontal chain guide or rail 568.

As best shown in FIG. 20, the transport drive means 30 comprises a vertically disposed transport drive sprocket 568 to engage and drive the continuous link chain 502 mounted on a horizontally disposed transport drive shaft 569 extending outwardly from a transport gear reducer 570 coupled to a transport motor 571 attached to the frame 32 and a vertically disposed transport idler sprocket 572 rotatably coupled to the frame 32 by a horizontally disposed transport idler shaft 573 to change the direction of travel of the continuous link chain 502 from the vertical to the horizontal to return to the clip engagement station 22.

Figure 29:
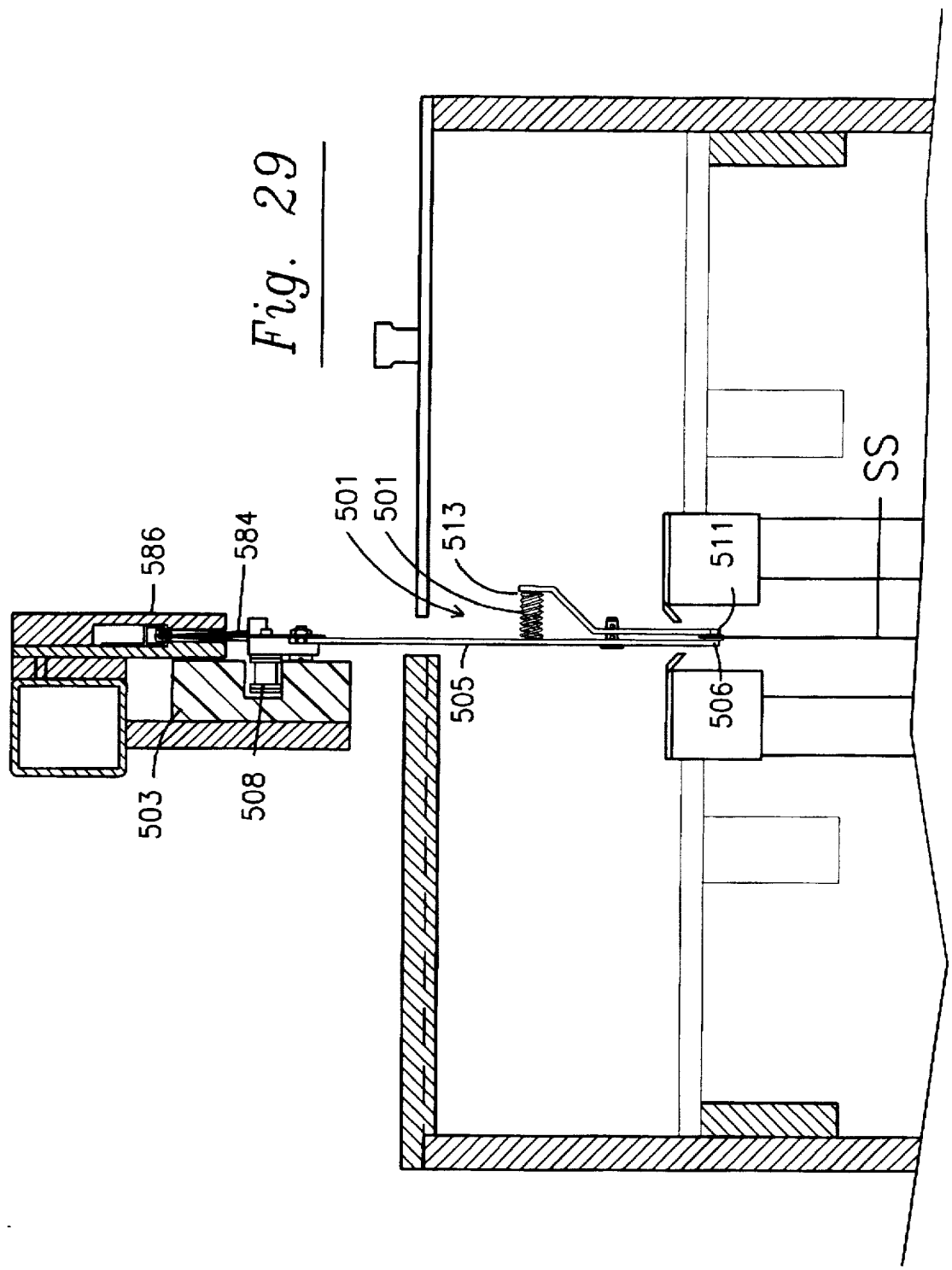
FIG. 29 is a detailed cross-sectional end view of the cathode means of the present invention taken along line 29—29 of FIG. 1.

As shown in FIGS. 1 and 2, electricity is supplied to the clips 501 transversing the processing cabinet 12 by a cathode means generally indicated as 582 extending substantially the length thereof. As best shown in FIG. 29, the cathode means 582 comprises a plurality of electrically conductive flexible cathode brushes generally indicated as 584 to engage the clip shoe or plate 580 such that electricity is fed from an electrically conductive cathode element 586 through the electrically conductive flexible brushes 584 to the first clamping tip 506 and the second clamping tip 511 through the corresponding flat back member 505 and the angled clamping element 509 respectively causing the first clamping tip 506 and the second clamping tip 511 to act as a cathode during processing of the continuous strip of substrate SS traversing the processing cabinet 12.

As shown in FIGS. 2, 20 and 24 through 26, the vertical processing system 10 may further include a clip stripping station generally indicated as 600 to remove processing materials from the clips 501 deposited thereon during the plating process comprising a clip deplating stage, a clip rinsing stage and a clip drying stage generally indicated as 602, 604 and 606 respectively.

Figure 24:
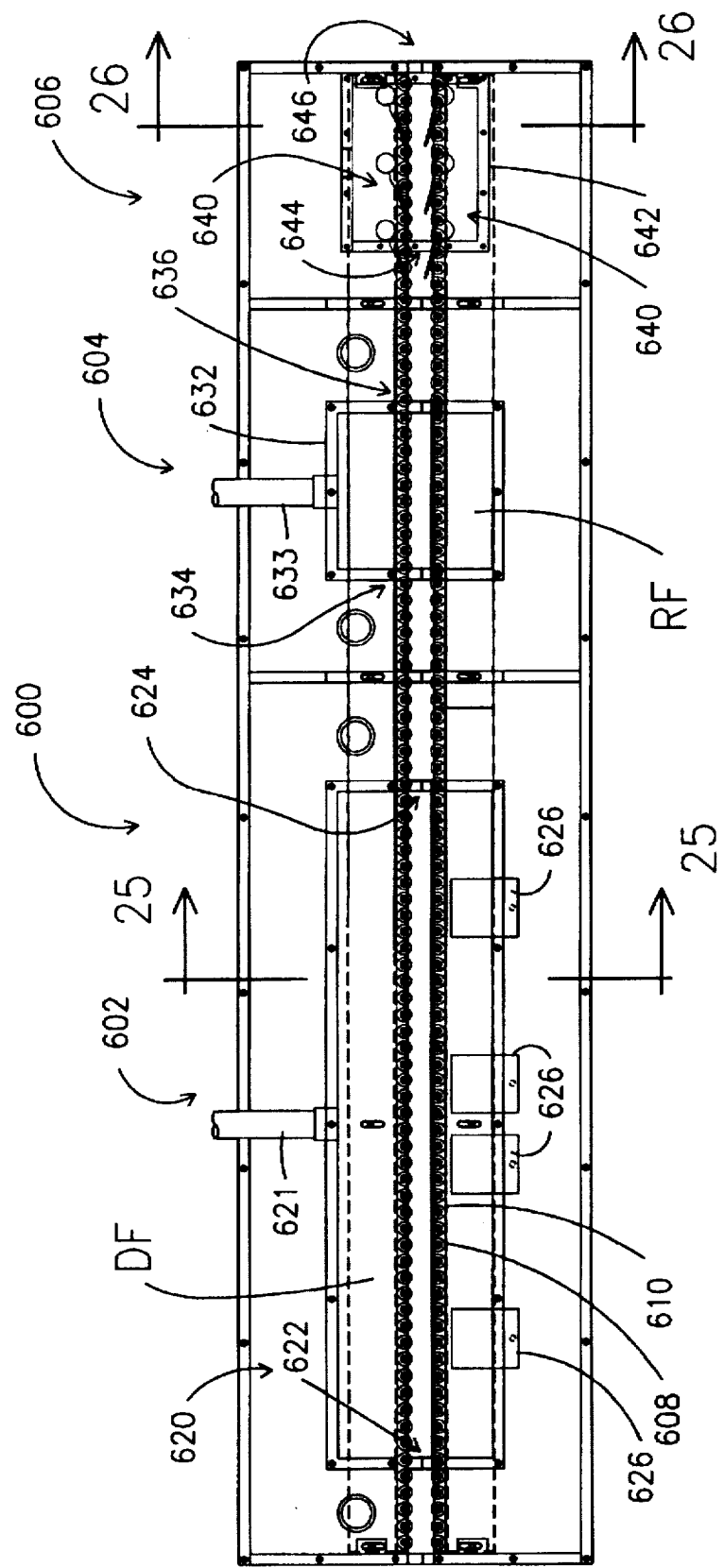
FIG. 24 is a detailed top view of the clip stripping station of the present invention.
Figure 25:
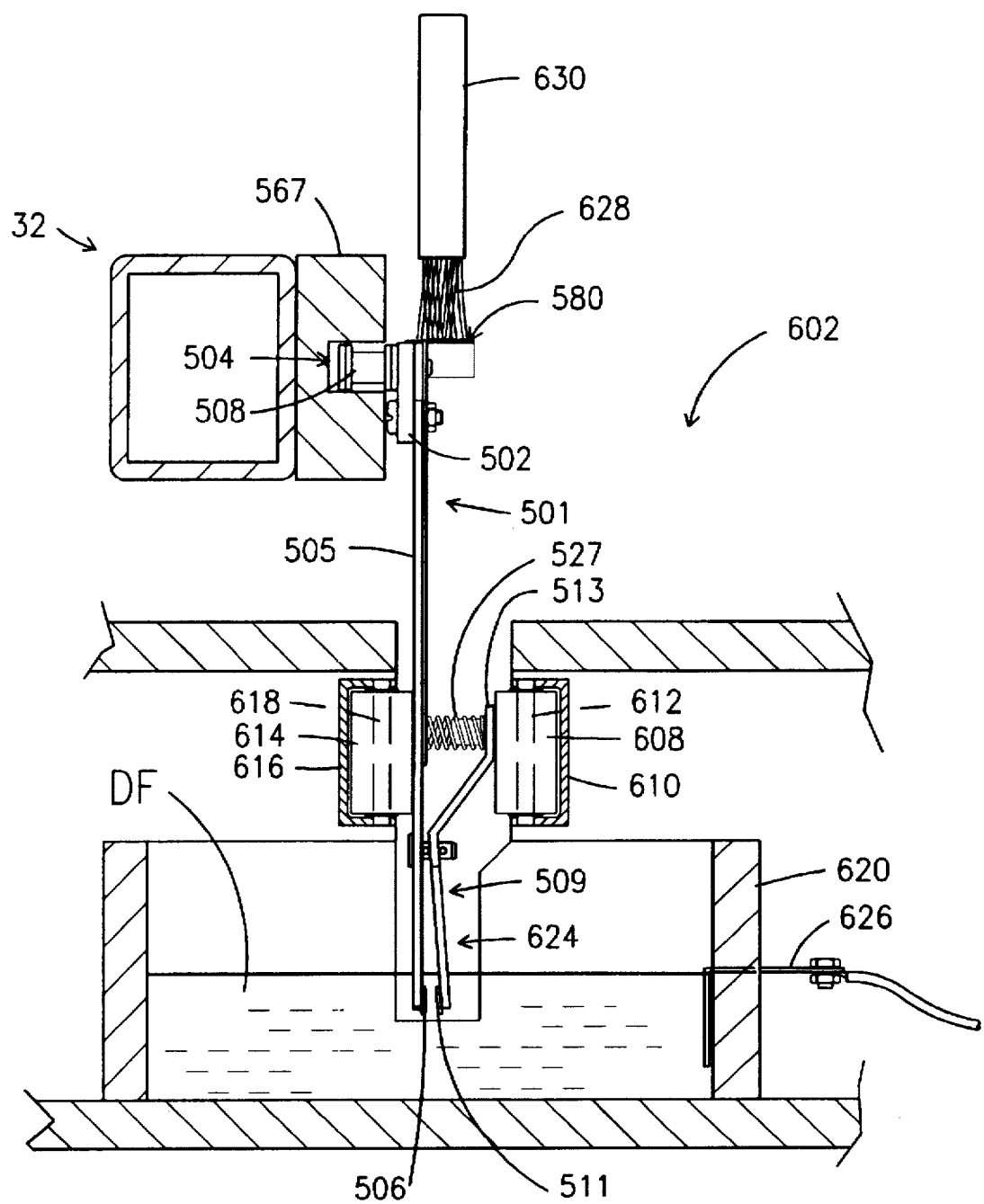
FIG. 25 is a cross-sectional end view of the clip deplating stage of the clip stripping station of the present invention taken along line 25—25 of FIG. 24.
Figure 26:
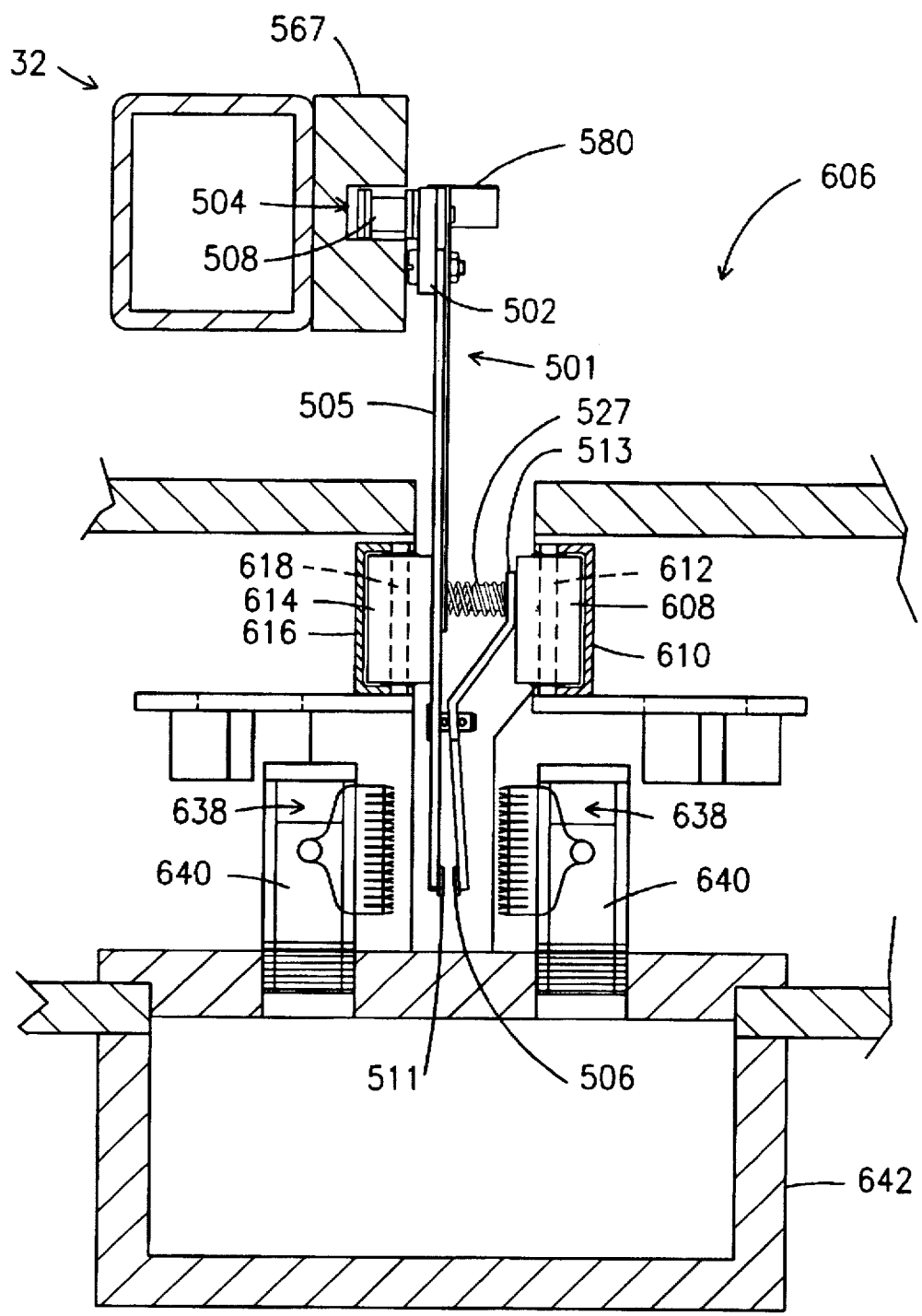
FIG. 26 is a cross-sectional end view of the clip drying stage of the clip stripping station of the present invention taken along lines 26—26 of FIG. 24.
Figure 27:
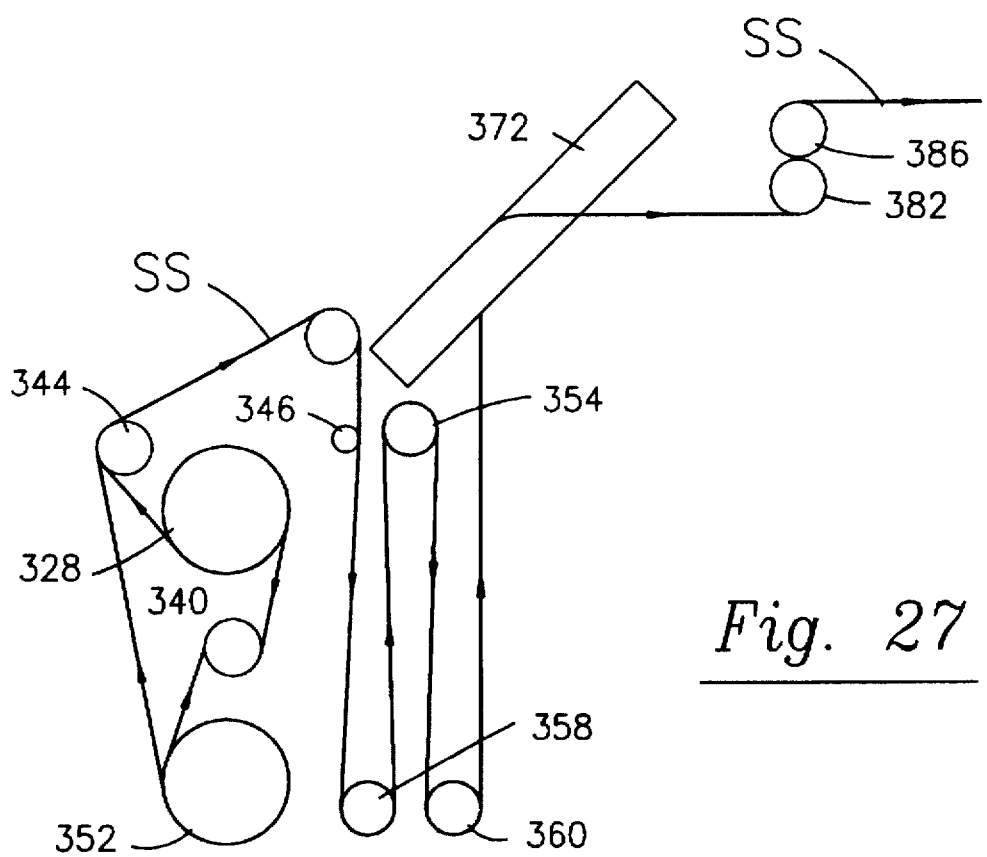
FIG. 27 is a schematic of the supply station of the present invention.
Figure 28:
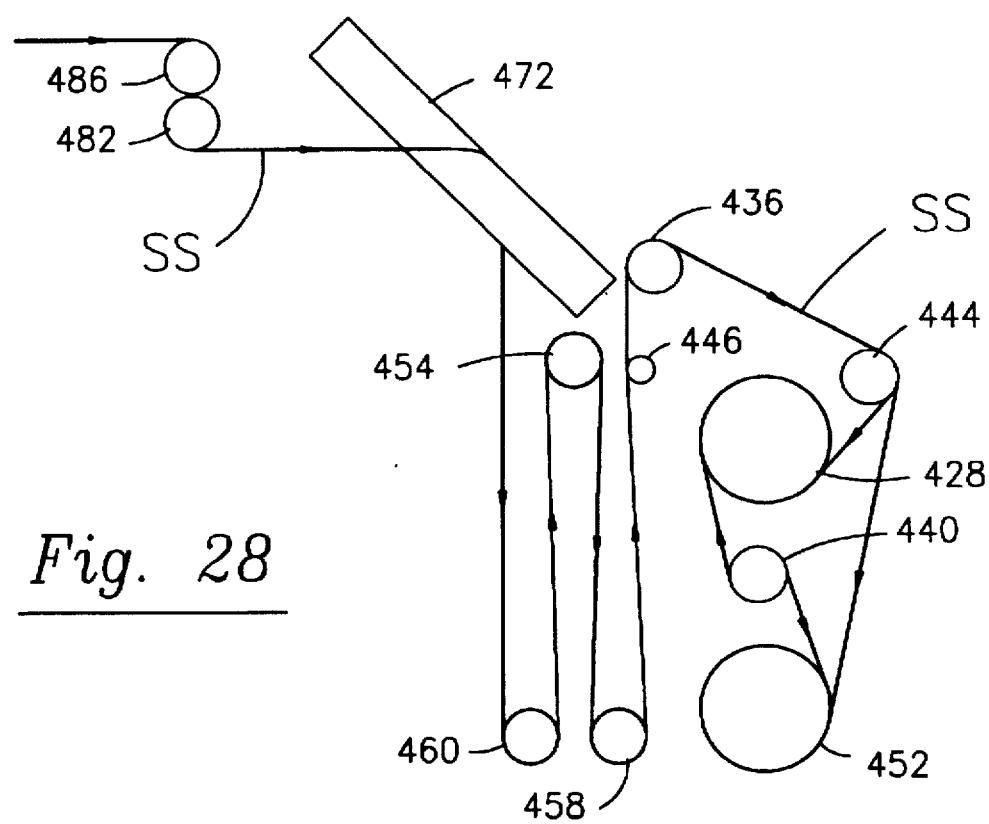
FIG. 28 is a schematic of the take-up staton of the present invention.

As best shown in FIGS. 24 through 26, a plurality of vertically disposed cam rollers each indicated as 608 are rotatably coupled to the flim processing cabinet 12 within a cam roller channel member 610 extending substantially the length of the clip stripping station 600 by a corresponding plurality of vertically disposed cam roller shafts each indicated as 612 disposed adjacent the longitudinal centerline of the processing cabinet 12 to engage the cam engaging member 513 of each individual clip 501 to open and separate the first and second clamping tips 506 and 511 relative to each other as the clips 501 traverse the deplating stage 602, the clip rinsing stage 604 and the clip drying stage 606.

Further, a plurality of vertically disposed back member stabilizer rollers each indicated as 614 are rotatable coupled to the processing cabinet 12 within a back member stabilizer roller channel member 616 extending substantially the length of the clip rinsing station 600 by a corresponding vertically disposed back member stabilizer roller shaft each indicated as 618 disposed adjacent the opposite side of the longitudinal centerline of the processing cabinet 12 from the vertically disposed cam rollers 608 to engage the flat back member 505 of each individual clip 501 to limit horizontal movement thereof as the clips 501 traverse the clip stripping station 600.

The clip deplating stage 602 comprises a deplating fluid reservoir 620 including an entry and an exit deplating slot indicated as 622 and 624 respectively formed on opposite ends thereof to permit the individual clips 501 to traverse the clip deplating stage 602 on the intermediate substantially horizontal chain guide or rail 567 to dip or immerse the first and second clamping tips 506 and 511 in a deplating fluid DF fed to the deplating fluid reservoir 620 from a external source (not shown) through a deplating fluid conduit 621, at least one anode 626 attached to the deplating fluid reservoir 620 in fluid communication with the deplating fluid DF and a deplating contact means including a plurality of electrically conductive flexible brushes generally indicated as 628 to engage the clip shoe or plate 580 formed on the end of the flat back member 505 opposite the first clamping tip 506 such that electricity is fed from an electrically conductive element 630 through the electrically conductive flexible brushes 628 to the first clamping tip 506 and the second clamping tip through the flat back member 505 and the angled clamping element 509 respectively causing plating material deposited on the first clamping tip 506 and the second clamping tip 511 during the plating process to migrate through the deplating fluid DF to the sacrificial anodes 626 to deplate the clips 501 traversing the clip deplating stage 602.

As best shown in FIGS. 20 and 24, the clip rinsing stage 604 comprises a rinsing fluid reservoir 632 including an entry and an exit rinsing slot indicated as 634 and 636 respectively formed on opposite ends thereof to permit the individual clips 501 to traverse through the clip rinsing stage 604 on the intermediate substantially horizontal chain guide or rail 567 to dip or immerse the first and second clamping tips 506 and 511 in a rinsing fluid RF feed to the rinsing fluid reservoir 632 from an external source (not shown) through a rinsing fluid conduit 633 to rinse the clips 501 traversing the clip rinsing stage 604.

As best shown in FIGS. 20 and 24 through 26, the clip drying stage 606 comprises a drying chamber cooperatively formed by a bank of drying elements generally indicated as 638 disposed within a corresponding drying conduit 640 located on opposite sides of the longitudinal centerline of the processing cabinet 12 to receive air from a dryer manifold 642. An entry and an exit drying slot indicated as 644 and 646 respectively are formed on opposite ends of the clip drying stage 606 to permit the individual film clips 501 to traverse therethrough on the intermediate substantially horizontal chain guide or rail 567 to expose both sides and the interior of the clips 501 to the forced air fed from the dryer manifold 642 through the drying conduit 640 to each corresonding bank of drying elements 638 to dry the clips 501 traversing the clip drying stage 606.

As the individual flim clips 501 exit the clip drying stage 606 of the clip stripping station 600, the vertically disposed cam rollers 608 disengage from the cam engagement members 513 such that the corresponding angled clamping elements 509 moves from the second or open position of the first or closed position under the force of the corresponding springs or bias 515 whereby the corresponding first and second clamping tips 506 and 511 reengage before entering the transport drive means 30.

As shown in FIG. 21, the vertical processing system 10 may further include a clip fluid spray means comprising a clip fluid spray dispenser 700 coupled to a liquid supply source (not shown) by a liquid supply conduit 702 disposed adjacent each side of the longitudinal centerline of the processing cabinet 12 to spray or apply a wall of leaning liquid or water to each side of the clips 501 immediately prior to entering the clip release camming section 551 of the clip release station 24.

Properly installed and assembled, power, control and monitoring signals are fed to and from the system control 26 through the electrical harness 28 to the transport motor 571 through the electrically conductive members 586 and 630 to the electrically conductive brushes 584 and 628 respectively operatively disposed to engage the clip shoes or plates 580 of the individual clips 501 traversing the processing cabinet 12 and the clip deplating stage 602 respectively to supply or feed electricity to the first and second clamping tip 506 and 511, and through the control/distribution junction box 34 to the supply adjustment assembly 322, the supply motor 334, the feed motor 392 and the air source 376 of the supply station 18 and through the control/distributor junction box 36 to the take-up vertical adjustment assembly 422, the take-up motor 434, the retrieval motor 492 and the air source 476 of the take-up station 20. In addition, power is fed through the electrical harness 28 to the various pumps (not shown) including a pump to provide pressurized solution to the first fluid seal assembly 130 and the second fluid seal assembly 132 and to a dryer for the clip drying stage 606.

The vertical processing system 10 is initially set-up by operatively positioning and coupling the continuous strip of substrate SS to the supply station 18, to the clip engagement station 22 and the clip release station 24 of the transport mechanism and to the take-up station 20 as best shown in FIGS. 1, 2, 27 and 28.

Figure 30:
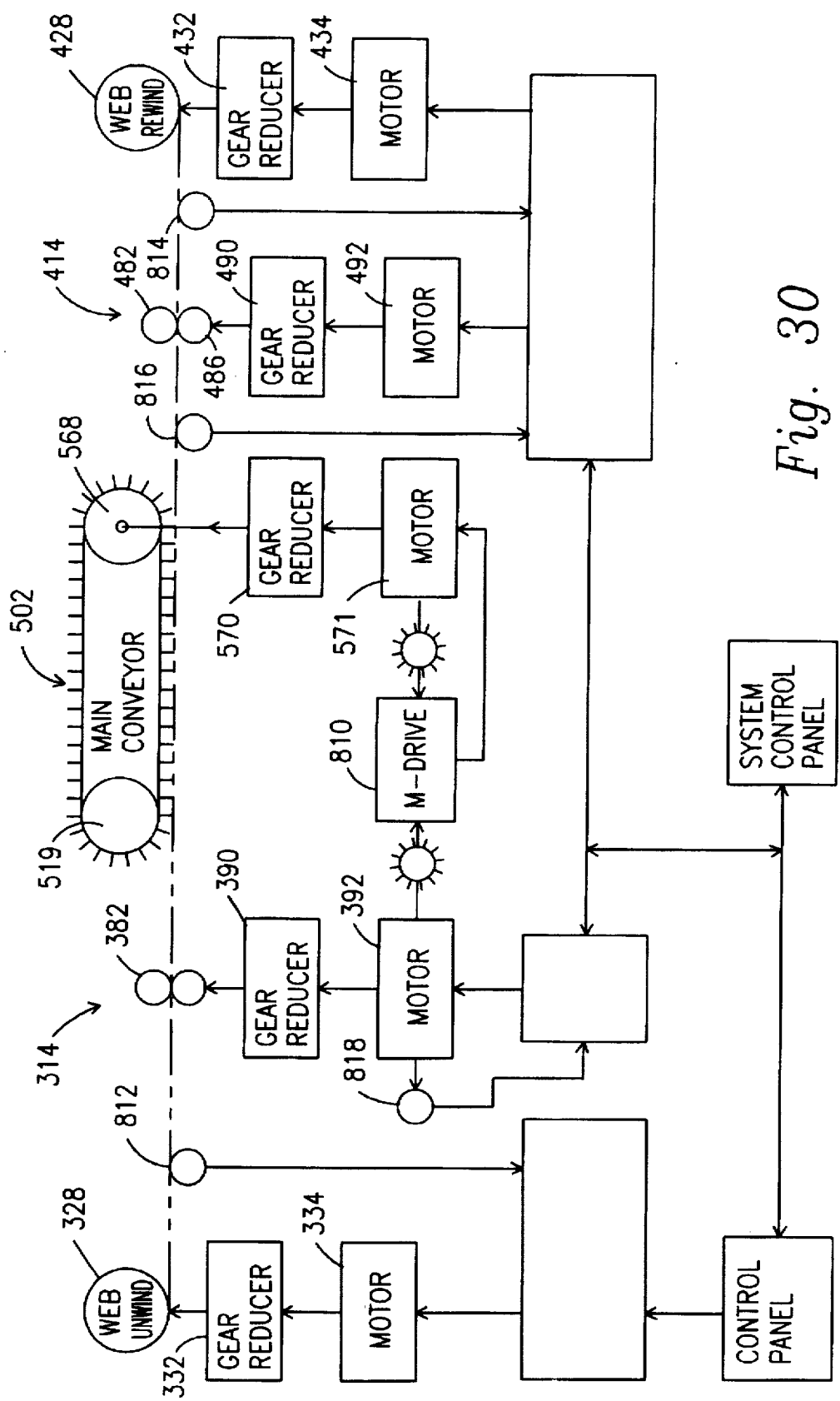
FIG. 30 is a schematic view of the system control of the present invention.

As best shown in FIGS. 1 through 4, the continuous strip of substrate SS traversing the processing cabinet 12 is isolated from the horizontally disposed supply spindle 328 and the supply station 18 and from the horizontally disposed take-up spindle 420 and the take-up station 20 by the feed assembly 314 and the retrieval assembly 414 respectively. As shown in FIG. 30, a master line speed control signal is fed from the system control 26 to the feed motor 392 to control the speed of the vertically disposed feed roller 386. The speed of the continuous link chain 502 is synchronized with the vertically disposed feed roller 386 through a main drive control 810 coupled between the feed motor 392 and the transport motor 571. So configured, the tension and speed of the continuous strip of substrate SS traversing the processing cabinet 12 between the clip engagement station 22 and the clip release station 24 is substantially constant.

The system control 26 further includes a supply force transducer 812 to detect the tension of the substrate SS between the horizontally disposed supply spindle 328 and the feed assembly 314, and a take-up force tranducer 814 to detect the tension of the substrate SS between the retrieval assembly 414 and the horizontally disposed take-up spindle 428 and a processing force transducer 816 to detect the tension of the substrate SS between the horizontally disposed supply spindle 328 and the feed assembly 314. In addition, a tachometer 818 is coupled to the feed motor 392 to generate a line speed reference signal corresponding to the master line speed control signal.

The outputs of the tachometer 818 and supply force transducer 812 are fed to the supply motor 334 to control the rotational speed of the horizontally disposed supply spindle 328; while, the outputs of the tachometer 818 and processing force transducer 816 and take-up force transducer 818 are fed to the retrieval motor 492 and the take-up motor 434 respectively to control the speed of vertically disposed retrieval motor 486 and the horizontally disposed take-up spindle 428 respectively.

Once the continuous strip of substrate SS is mounted on the the vertical processing system 10, the continuous strip of substrate SS is transported through the film processing module 112 by the transport mechanism exposing the continuous strip of substrate SS to a processing fluid from the bank of fluid spray tubes 124. The continuous strip of substrate SS is then transported through the rinsing stage 138 and drying stage 140. As previously described, the processing fluid is substantially retained in the processing chamber 128 by the first and second fluid seal assemblies 130 and 132.

Although the vertical processing system 10 is described as processing a continuous strip of substrate SS, the vertical processing system 10 can be configured to process other media such as a substantially rigid circuit boards.

It will thus be seen that the objects set forth above, among those made apparent from the preceding description are efficiently attained and since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,
What is claimed is:

1. A processing system for electro-coating, wet process surface finishing or plating vertically disposed substrates to produce printed circuits or other finished materials, said processing system comprising a processing cabinet having a entry opening and an exit opening formed on opposite ends thereof, a supply station and a take-up station disposed adjacent said entry opening and said exit opening respectively, a transport mechanism including a substrate engagement station and a substrate release station to transport the substrate from said supply station through said entry opening said processing cabinet and said exit opening to said take-up station, said processing cabinet comprises a processing module including at least one processing zone having a pair of fluid retention side walls cooperatively forming a processing chamber therebetween and including an entry opening and an exit opening formed at opposite ends thereof, said processing module further including a first and second fluid seal assembly disposed adjacent said entry opening and said exit opening respectively to retain the processing fluid within said processing chamber, said first and second fluid seal assembly each comprises a corresponding fluid seal element attached to the end portion of each said fluid retention side wall such that said corresponding pair of fluid seal elements disposed on each end of said processing chamber cooperatively form a substrate receiving slot therebetween to create a fluid seal to virtually seal said entry opening and said exit opening, said fluid seal assembly includes a fluid seal element comprising a fluid supply means to supply a sealing fluid to said first and second fluid seal assemblies and a fluid directional control means to control the direction of the sealing fluid in said processing chamber, each said fluid supply means comprises a fluid supply tube having a vertically disposed elongated outlet coupled to a fluid source to receive sealing fluid therefrom and each said fluid directional control means comprises a first fluid directional control member and a second fluid directional control member disposed adjacent each other to cooperatively form a vertically disposed elongated fluid flow opening to force the sealing fluid into said processing chamber creating a fluid barrier immediately adjacent each side of the substrate to retain the processing fluid in said processing chamber and said fluid directional control means includes a first fluid directional control member including a concave surface and said second fluid directional control member includes a convex surface disposed adjacent said concave surface of said first fluid directional control member to cooperatively form said vertically disposed elongated fluid flow opening.

2. The processing system of claim 1 wherein said fluid directional member further includes a flange including a first planar surface extending outwardly from said concave surface and said second fluid directional control member further includes a second planar surface disposed in substantially parallel relationship relative to said first planar surface to cooperatively form said vertically disposed elongated fluid flow opening.

3. The processing system of claim 2 wherein said flange includes a first planar surface extending beyond said second planar surface to reduce cavitation of the sealing fluid.

4. A processing system for electro-coating, wet process surface finishing or plating vertically disposed substrates to produce printed circuits or other finished materials, said processing system comprising a processing cabinet having a entry opening and an exit opening formed on opposite ends thereof, a supply station and a take-up station disposed adjacent said entry opening and said exit opening respectively, a transport mechanism including a substrate engagement station and a substrate release station to transport the substrate from said supply station through said entry opening said processing cabinet and said exit opening to said take-up station wherein said supply station comprises a supply assembly to supply a horizontally disposed continuous strip of unprocessed substrate, a sup ply directional change assembly to reposition the continuous strip of unprocessed substrate from the horizontal to vertical and a supply feed assembly to feed the vertically disposed continuous strip of unprocessed substrate to said substrate engagement station.

5. The processing system of claim 4 wherein said supply assembly comprises a supply unwind section including a horizontally disposed supply spindle to supply a continuous strip of unprocessed substrate mounted on a horizontally disposed supply spindle shaft, said supply directional change assembly comprises a diagonally disposed hollow substantially cylindrical perforated member and a positive pressure air source coupled to said diagonally disposed hollow substantially cylindrical perforated member by an air supply conduit to supply air to the interior of said diagonally disposed hollow substantially cylindrical perforated member to create an air cushion on the outer surface thereof such that said diagonally disposed hollow substantially cylindrical perforated member forms an air bearing to change the disposition of the continuous strip of unprocessed substrate from the horizontal when exiting said supply assembly to the vertical when entering said supply feed assembly and said supply feed assembly comprises a vertically disposed supply feed idler roller and a vertically disposed supply feed roller to feed the continuous strip of unprocessed substrate into said processing cabinet through said entry opening.

6. A processing system for electro-coating, wet process surface finishing or plating vertically disposed substrates to produce printed circuits or other finished materials, said processing system comprising a processing cabinet having a entry opening and an exit opening formed on opposite ends thereof, a supply station and a take-up station disposed adjacent said entry opening and said exit opening respectively, a transport mechanism including a substrate engagement station and a substrate release station to transport the substrate from said supply station through said entry opening said processing cabinet and said exit opening to said take-up station wherein said take-up station comprises a retrieval assembly to receive the vertically disposed continuous strip of processed substrate to said substrate release station, a take-up directional change assembly to reposition the continuous strip of processed substrate from the vertical to the horizontal and a take-up assembly to retrieve the horizontally disposed continuous strip of processed substrate.

7. The processing system of claim 6 wherein said take-up assembly comprises a take-up section including a horizontally disposed spindle to retrieve a continuous strip of processed substrate mounted on a horizontally disposed spindle shaft, said take-up directional change assembly comprises a diagonally disposed hollow substantially cylindrical perforated member and a positive pressure air source coupled to said diagonally disposed hollow substantially cylindrical perforated member by an air supply conduit to supply air to the interior of said diagonally disposed hollow substantially cylindrical perforated member to create an air cushion on the outer surface thereof such that said diagonally disposed hollow substantially cylindrical perforated member forms an air bearing to change the disposition of the continuous strip of processed substrate from the vertical when exiting said retrieval assembly to the horizontal when entering said take-up assembly, said retrieval assembly comprises a vertically disposed supply feed idler roller and a vertically disposed supply feed roller to receive the continuous strip of processed substrate from said processing cabinet through said exit opening.

8. A processing system for electro-coating, wet process surface finishing or plating vertically disposed substrates to produce printed circuits or other finished materials, said processing system comprising a processing cabinet having a entry opening and an exit opening formed on opposite ends thereof, a supply station and a take-up station disposed adjacent said entry opening and said exit opening respectively, a transport mechanism including a substrate engagement station and a substrate release station to transport the substrate from said supply station through said entry opening said processing cabinet and said exit opening to said take-up station wherein said supply station comprises a supply assembly to supply a horizontally disposed continuous strip of unprocessed substrate, a supply directional change assembly to reposition the continuous strip of unprocessed substrate from the horizontal to vertical and a supply feed assembly to feed the vertically disposed continuous strip of unprocessed substrate to said substrate engagement station and said take-up station comprises a retrieval assembly to receive the vertically disposed continuous strip of processed substrate to said substrate release station, a take-up assembly to retrieve the horizontally disposed continuous strip of processed substrate, a take-up directional change assembly to reposition the continuous strip of processed substrate from the horizontal to the vertical.

9. The processing system of claim 8 wherein said supply assembly comprises a supply unwind section including a horizontally disposed supply spindle to supply a continuous strip of unprocessed substrate mounted on a horizontally disposed supply spindle shaft, said supply directional change assembly comprises a diagonally disposed hollow substantially cylindrical perforated member and a positive pressure air source coupled to said diagonally disposed hollow substantially cylindrical perforated member by an air supply conduit to supply air to the interior of said diagonally disposed hollow substantially cylindrical perforated member to create an air cushion on the outer surface thereof such that said diagonally disposed hollow substantially cylindrical perforated member forms an air bearing to change the disposition of the continuous strip of unprocessed substrate from the horizontal when exiting said supply assembly to the vertical when entering said supply feed assembly and said supply feed assembly comprises a vertically disposed supply feed idler roller and a vertically disposed supply feed roller to feed the continuous strip of unprocessed substrate into said processing cabinet through said entry opening and said take-up assembly comprises a take-up section including a horizontally disposed spindle to retrieve a continuous strip of processed substrate mounted on a horizontally disposed spindle shaft, said take-up directional change assembly comprises a diagonally disposed hollow substantially cylindrical perforated member and a positive pressure air source coupled to said diagonally disposed hollow substantially cylindrical perforated member by an air supply conduit to supply air to the interior of said diagonally disposed hollow substantially cylindrical perforated member to create an air cushion on the outer surface thereof such that said diagonally disposed hollow substantially cylindrical perforated member forms an air bearing to change the disposition of the continuous strip of processed substrate from the vertical when exiting said take-up assembly to the horizontal when entering said retrieval assembly, said retrieval assembly comprises a vertically disposed supply feed idler roller and a vertically disposed supply feed roller to receive the continuous strip of processed substrate from said processing cabinet through said exit opening.

10. A processing system for electro-coating, wet process surface finishing or plating vertically disposed substrates to produce printed circuits or other finished materials, said processing system comprising a processing cabinet having a entry opening and an exit opening formed on opposite ends thereof, a supply station and a take-up station disposed adjacent said entry opening and said exit opening respectively, a transport mechanism including a substrate engagement station and a substrate release station to transport the substrate from said supply station through said entry opening said processing cabinet and said exit opening to said take-up station wherein said transport mechanism includes a plurality of clips attached to a continuous link chain extending between said substrate engagement station, said substrate release station and a transport drive means.

11. The processing system of claim 10 wherein each clip comprises a back member including a first clamping tip attached to said continuous link chain and a clamping member including a second clamping tip pivotally coupled to said back member movable between a closed position and an open position to selectively engage and release the substrate at said substrate engagement station and said substrate release station respectively.

12. The processing system of claim 11 wherein each said clip further includes a bias disposed between said flat back member and said clamping member to normally maintain each said clip in said closed position with said first and second clamping tips in operative engagement relative to each other.

13. The processing system of claim 11 wherein said substrate engagement station comprises a rotatable cam element and a cam plate having a cam surface formed thereon disposed to selectively engage said cam element such that said cam element engages said clamping member to move said clamping member to said open position as said clips traversing said substrate engagement station and to disengage said clamping member to move said clamping member to said closed position to clamp the upper edge of the substrate between said corresponding first and second clamping tips.

14. The processing system of claim 13 wherein said cam element comprises a cam member having a plurality of engagement station cam actuators mounted thereon, each said engagement station cam actuator comprises a cam rod selectively movable between a first and second position extending through a corresponding cam rod aperture formed through said cam member.

15. The processing system of claim 14 wherein each said cam rod includes a first camming surface and a second camming surface formed on opposite ends thereof to selectively engage said cam surface of said cam plate and said cam engaging member respectively to engage said clips traveling through said substrate engagement station such that said corresponding first and second clamping tips to clamp the substrate for transport through said processing cabinet.

16. The processing system of claim 11 wherein said vertical processing system further includes a clip stripping station to remove processing materials from said clips deposited thereon during processing.

17. The processing system of claim 16 wherein said clip stripping station comprises a clip deplating stage including a deplating fluid reservoir having an entry and an exit deplating slot formed on opposite ends thereof to permit said clips to traverse through said clip deplating stage to immerse said first and second clamping tips in a deplating fluid and at least one anode in fluid communication with the deplating fluid and a deplating contact means including a plurality of electrically conductive flexible brushes to engage said clamps such that electricity is fed through said electrically conductive flexible brushes to said first clamping tip and said second clamping tip causing plating material deposited thereon during the plating process to migrate through the deplating fluid to said anode to deplate said clips traversing said clip deplating stage.

18. The processing system of claim 17 wherein said clip deplating stage further includes a plurality of vertically disposed cam rollers disposed adjacent the longitudinal centerline of said processing cabinet to engage said cam engaging member of said clips to open said first and second clamping tips relative to each other as said clips traverse said deplating stage.

19. The processing system of claim 18 wherein said clip deplating further includes a plurality of vertically disposed back member stabilizer rollers disposed adjacent the opposite side of the longitudinal centerline of said processing cabinet to engage said flat back member of each said clip to limit horizontal movement thereof as said clips traverse said clip stripping station.

20. The processing system of claim 16 wherein said clip stripping station further includes a clip rinsing stage comprising a rinsing fluid reservoir including an entry and an exit rinsing slot formed on opposite ends thereof to permit said clips to traverse through said clip rinsing stage to immerse said first and second clamping tips in a rinsing fluid feed to rinse said clips traversing said clip rinsing stage.

21. The processing system of claim 20 wherein said clip stripping further includes a clip drying stage comprises a drying chamber cooperatively formed by a bank of drying elements disposed within a corresponding drying conduit located on opposite sides of the longitudinal centerline of said processing cabinet to receive air from a dryer manifold, an entry and an exit drying slot formed on opposite ends of the clip drying stage to permit said flim clips to traverse therethrough to expose both sides and the interior of said clips to the forced air fed from said dryer manifold through said drying conduit to each corresonding bank of drying elements to dry said clips traversing said clip drying stage.

22. The processing system of claim 10 wherein said substrate release station comprises camming station comprises a plurality of release station cam members rotatably coupled to a portion of said processing cabinet disposed adjacent the longitudinally centerline of said processing cabinet to engage said cam engaging members of said clips traversing said clip camming section to open said clips traversing said clip release station to release the edge of the continuous strip of substrate from said clips before exiting said processing cabinet.

23. The processing system of claim 22 wherein said substrate release station further comprises a clip release directional transition section disposed to transport said clips diagonally upward away from substrate before said camming surfaces disengage from said corresponding cam engagement members such that said clamping member moves from said open position to said closed position whereby said the corresponding first and second clamping tips reengage without clamping the substrate therebetween.

24. The processing system of claim 23 wherein said clip release directional transition section comprises a first and second vertically disposed release sprocket rotatably coupled to said vertical processing system to transport said continuous link chain and said clips from the clip release camming section to said transport drive means.

25. The processing system of claim 22 further including a corresponding plurality of vertically disposed back stabilizer pins disposed adjacent the opposite side of the longitudinal centerline of said processing cabinet from said horizontally disposed release station cam members to engage said flat back members of said clips traversing said clip release camming station.

26. The processing system of claim 10 wherein each clip comprises a back member including a first clamping tip attached to said continuous link chain and a clamping member including a second clamping tip pivotally coupled to said back member movable between a closed position and an open position to selectively engage and release the substrate at said substrate engagement station and said substrate release station respectively, said substrate engagement station comprises a rotatable cam element and a cam plate having a cam surface formed thereon disposed to selectively engage said cam element such that said cam element engages said clamping member to move said clamping member to said open position as said clips traversing said substrate engagement station and to disengage said clamping member to move said clamping member to said closed position to clamp the upper edge of the substrate between said corresponding first and second clamping tips and said substrate release station comprises camming station comprises a plurality of release station cam members rotatably coupled to a portion of said processing cabinet disposed adjacent the longitudinally centerline of said processing cabinet to engage said cam engaging members of said clips traversing said clip camming section to open said clips traversing said clip release station to release the edge of the continuous strip of substrate from said clips before exiting said processing cabinet.

27. The processing system of claim 26 wherein said substrate release station further comprises a clip release directional transition section disposed to transport said clips diagonally upward away from substrate before said camming surfaces disengage from said corresponding cam engagement members such that said clamping member moves from said open position to said closed position whereby said the corresponding first and second clamping tips reengage without clamping the substrate therebetween.

28. The processing system of claim 27 wherein said cam element comprises a cam member having a plurality of engagement station cam actuators mounted thereon, each said engagement station cam actuator comprises a cam rod selectively movable between a first and second position extending through a corresponding cam rod aperture formed through said cam member, each said cam rod includes a first camming surface and a second camming surface formed on opposite ends thereof to selectively engage said cam surface of said cam plate and said cam engaging member respectively to engage said clips traveling through said substrate engagement station such that said corresponding first and second clamping tips to clamp the substrate for transport through said processing cabinet.

29. A fluid seal assembly for use with fluid processing system including a fluid processing chamber or reservoir to retain processing fluid therein, said fluid seal assembly being disposed adjacent an opening in the processing chamber or reservoir to contain the processing fluid within the processing chamber or reservoir, said fluid seal assembly comprises a fluid seal element attached to each side of the processing chamber or reservoir such that said fluid seal elements cooperatively form a slot therebetween to create a fluid seal to virtually seal the opening formed in the processing chamber or reservoir and a fluid supply means to supply a sealing fluid to said fluid seal assembly and a fluid directional control means to control the direction of sealing fluid in the processing chamber or reservoir, said fluid supply means comprises a fluid supply tube having a vertically disposed elongated outlet coupled to a fluid source to receive sealing fluid therefrom and said fluid directional control means comprises a first fluid directional control member and a second fluid directional control member disposed adjacent each other to cooperatively form a vertically disposed elongated fluid flow opening to force the sealing fluid into the processing chamber or reservoir creating a fluid barrier immediately adjacent each side of the opening to retain the processing fluid in the processing chamber or reservoir and said fluid directional control means includes a first fluid directional control member including a concave surface and said second fluid directional control member includes a convex surface disposed adjacent said concave surface of said first fluid directional control member to cooperatively form said vertically disposed elongated fluid flow opening.

30. The fluid seal assembly claim 29 wherein said fluid directional member further includes a flange including a first planar surface extending outwardly from said concave surface and said second fluid directional control member further includes a second planar surface disposed in substantially parallel relationship relative to said first planar surface to cooperatively form said vertically disposed elongated fluid flow opening.

31. The fluid seal assembly of claim 30 wherein said first planar surface extends beyond said second planar surface to reduce cavitation of the sealing fluid.

32. A supply station to provide a continuous strip of unprocessed substrate to a processing system wherein said supply station comprises a supply assembly to supply a horizontally disposed continuous strip of unprocessed substrate a supply directional change assembly to reposition the continuous strip of unprocessed substrate from the horizontal to vertical and a supply feed assembly to feed the vertically disposed continuous strip of unprocessed substrate to the processing system wherein said supply assembly comprises a supply unwind section including a horizontally disposed supply spindle to supply a continuous strip of unprocessed substrate mounted on a horizontally disposed supply spindle shaft, said supply directional change assembly comprises a diagonally disposed hollow perforated member and a positive pressure air source coupled to said diagonally disposed hollow perforated member to supply air to the interior of said diagonally disposed hollow perforated member to create an air cushion on the outer surface thereof such that said diagonally disposed hollow substantially cylindrical perforated member forms an air bearing to change the disposition of the continuous strip of unprocessed substrate from the horizontal when exiting said supply assembly to the vertical when entering said supply feed assembly and said supply feed assembly comprises a vertically disposed supply feed idler roller and a vertically disposed supply feed roller to feed the continuous strip of unprocessed substrate to the processing system.

33. A take-up station to retrieve a continuous strip of processed substrate from a processing system wherein said take-up station comprises a take-up assembly to receive the vertically disposed continuous strip of processed substrate from the processing system, a take-up directional change assembly to reposition the continuous strip of processed substrate from the vertical to the horizontal and a retrieval assembly to retrieve the horizontally disposed continuous strip of processed substrate wherein said retrieval assembly comprises a retrieval section including a horizontally disposed spindle to retrieve a continuous strip of processed substrate mounted on a horizontally disposed spindle shaft, said take-up directional change assembly comprises a diagonally disposed hollow perforated member and a positive pressure air source coupled to said diagonally disposed hollow perforated member to supply air to the interior of said diagonally disposed hollow perforated member to create an air cushion on the outer surface thereof such that said diagonally disposed hollow perforated member forms an air bearing to change the disposition of the continuous strip of processed substrate from the vertical when exiting said take-up assembly to the horizontal when entering said retrieval assembly, said take-up assembly comprises a vertically disposed supply feed idler roller and a vertically disposed supply feed roller to receive the continuous strip of processed substrate from said processing cabinet through said exit opening.

34. A supply station to provide a continuous strip of unprocessed substrate to a processing system and a take-up station to retrieve the continuous strip of processed substrate from the processing system wherein said supply station comprises a supply assembly to supply a horizontally disposed continuous strip of unprocessed substrate, a supply directional change assembly to reposition the continuous strip of unprocessed substrate from the horizontal to vertical and a supply feed assembly to feed the vertically disposed continuous strip of unprocessed substrate to the processing system and said take-up station comprises a take-up assembly to receive the vertically disposed continuous strip of processed substrate from the processing system, a take-up directional change assembly to reposition the continuous strip of processed substrate from the vertical to the horizontal and a retrieval assembly to retrieve the horizontally disposed continuous strip of processed substrate wherein said supply directional change assembly comprises a diagonally disposed hollow perforated member and a positive pressure air source coupled thereto by an air supply conduit to supply air to the interior of said diagonally disposed hollow perforated member to create an air cushion on the outer surface thereof such that said diagonally disposed hollow perforated member forms an air bearing to change the disposition of the continuous strip of unprocessed substrate from the horizontal when exiting said supply assembly to the vertical when entering said supply feed assembly and said take-up directional change assembly comprises a diagonally disposed hollow perforated member and a positive pressure air source coupled thereto by an air supply conduit to supply air to the interior of said diagonally disposed hollow perforated member to create an air cushion on the outer surface thereof such that said diagonally disposed hollow perforated member forms an air bearing to change the disposition of the continuous strip of processed substrate from the vertical when exiting said retrieval assembly to the horizontal when entering said take-up assembly.

35. A transport mechanism to transport or carry a substrate through a processing system for coating or plating wherein said transport mechanism includes a plurality of clips attached to a continuous link chain extending between a substrate engagement station, a substrate release station and a transport drive means wherein each clip comprises a back member including a first clamping tip attached to said continuous link chain and a clamping member including a second clamping tip pivotally coupled to said back member movable between a closed position and an open position to selectively engage and release the substrate at said substrate engagement station and said substrate release station respectively.

36. The processing system of claim 35 wherein each said clip further includes a bias disposed between said flat back member and said clamping member to normally maintain each said clip in said closed position with said first and second clamping tips in operative engagement relative to each other.

37. The processing system of claim 35 wherein said substrate engagement station comprises a rotatable cam element and a cam plate having a cam surface formed thereon disposed to selectively engage said cam element such that said cam element engages said clamping member to move said clamping member to said open position as said clips traversing said substrate engagement station and to disengage said clamping member to move said clamping member to said closed position to clamp the upper edge of the substrate between said corresponding first and second clamping tips.

38. The processing system of claim 37 wherein said cam element comprises a cam member having a plurality of engagement station cam actuators mounted thereon, each said engagement station cam actuator comprises a cam rod selectively movable between a first and second position extending through a corresponding cam rod aperture formed through said cam member.

39. The processing system of claim 38 wherein each said cam rod includes a first camming surface and a second camming surface formed on opposite ends thereof to selectively engage said cam surface of said cam plate and said cam engaging member respectively to engage said clips traveling through said substrate engagement station such that said corresponding first and second clamping tips to clamp the substrate for transport through the processing system.

40. A transport mechanism to transport or carry a substrate through a processing system for coating or plating wherein said transport mechanism includes a plurality of clips attached to a continuous link chain extending between a substrate engagement station, a substrate release station and a transport drive means wherein said substrate release station comprises camming station comprises a plurality of release station cam members rotatably coupled to a portion of said processing cabinet disposed adjacent the longitudinally centerline of said processing cabinet to engage said cam engaging members of said clips traversing said clip camming section to open said clips traversing said clip release station to release the edge of the continuous strip of substrate from said clips before exiting the processing system.

41. The processing system of claim 40 wherein said substrate release station further comprises a clip release directional transition section disposed to transport said clips diagonally upward away from substrate before said camming surfaces disengage from said corresponding cam engagement members such that said clamping member moves from said open position to said closed position whereby said the corresponding first and second clamping tips reengage without clamping the substrate therebetween.

42. The processing system of claim 41 wherein said clip release directional transition section comprises a first and second vertically disposed release sprocket rotatable coupled to said vertical processing system to transport said continuous link chain and said clips from the clip release camming section to said transport drive means.

43. The processing system of claim 40 further including a corresponding plurality of vertically disposed back stabilizer pins disposed adjacent the opposite side of the longitudinal centerline of said processing cabinet from said horizontally disposed release station cam members to engage said flat back members of said clips traversing said clip release camming station.

44. A transport mechanism to transport or carry a substrate through a processing system for coating or plating wherein said transport mechanism includes a plurality of clips attached to a continuous link chain extending between a substrate engagement station, a substrate release station and a transport drive means wherein each clip comprises a back member including a first clamping tip attached to said continuous link chain and a clamping member including a second clamping tip pivotally coupled to said back member movable between a closed position and an open position to selectively engage and release the substrate at said substrate engagement station and said substrate release station respectively, said substrate engagement station comprises a rotatable cam element and a cam plate having a cam surface formed thereon disposed to selectively engage said cam element such that said cam element engages said clamping member to move said clamping member to said open position as said clips traversing said substrate engagement station and to disengage said clamping member to move said clamping member to said closed position to clamp the upper edge of the substrate between said corresponding first and second clamping tips and said substrate release station comprises camming station comprises a plurality of release station cam members rotatably coupled to a portion of said processing cabinet disposed adjacent the longitudinally centerline of said processing cabinet to engage said cam engaging members of said clips traversing said clip camming section to open said clips traversing said clip release station to release the edge of the continuous strip of substrate from said clips before exiting said processing cabinet.

45. The processing system of claim 44 wherein said substrate release station further comprises a clip release directional transition section disposed to transport said clips diagonally upward away from substrate before said camming surfaces disengage from said corresponding cam engagement members such that said clamping member moves from said open position to said closed position whereby said the corresponding first and second clamping tips reengage without clamping the substrate therebetween.

46. The processing system of claim 45 wherein said cam element comprises a cam member having a plurality of engagement station cam actuators mounted thereon, each said engagement station cam actuator comprises a cam rod selectively movable between a first and second position extending through a corresponding cam rod aperture formed through said cam member, each said cam rod includes a first camming surface and a second camming surface formed on opposite ends thereof to selectively engage said cam surface of said cam plate and said cam engaging member respectively to engage said clips traveling through said substrate engagement station such that said corresponding first and second clamping tips to clamp the substrate for transport through the processing system.

47. A fluid seal assembly for use with fluid processing system to process a substrate including a fluid processing chamber or reservoir to retain processing fluids therein, said fluid seal assembly being disposed adjacent an opening in the processing chamber or reservoir to contain the processing fluid within the processing chamber or reservoir, said fluid seal assembly comprises a fluid seal element attached to each side of the processing chamber or reservoir such that said fluid seal elements cooperatively form a slot therebetween for receiving the substrate therethrough and to create a fluid seal to virtually seal the opening formed in the processing chamber or reservoir, each said fluid seal element comprises a fluid supply means to supply a sealing fluid to said fluid seal assembly and a fluid directional control means comprising a first fluid directional control member and a second fluid directional control member disposed adjacent to each other to cooperatively form a vertically disposed elongated fluid flow opening adjacent the substrate to direct the sealing fluid in a direction substantially parallel to the direction of travel of the substrate to force the sealing fluid into the processing chamber or reservoir creating a fluid barrier immediately adjacent each side of the opening to retain the processing fluid in the processing chamber or reservoir.

48. The fluid seal assembly of claim 47 wherein said fluid directional control means includes a first fluid directional control member including a concave surface and said second fluid directional control member includes a convex surface disposed adjacent said concave surface of said first fluid directional control member to cooperatively form said vertically disposed elongated fluid flow opening.

* * * * *